United States Patent [19]

Tada et al.

[11] Patent Number: 5,662,822
[45] Date of Patent: Sep. 2, 1997

[54] DAM BAR CUTTING APPARATUS AND DAM BAR CUTTING METHOD

[75] Inventors: Nobuhiko Tada, Ushiku; Kojiro Ogata, Ishioka; Naoki Miyanagi; Yoshiaki Shimomura, both of Ibaraki-ken; Shigeyuki Sakurai, Tsukuba; Yoshinari Nagano; Shinya Okumura, both of Ibaraki-ken; Yasushi Minomoto, Tsukuba, all of Japan

[73] Assignee: Hitachi Construction Machinery Co., Ltd., Tokyo, Japan

[21] Appl. No.: 648,026

[22] PCT Filed: Oct. 9, 1995

[86] PCT No.: PCT/JP95/02064
§ 371 Date: May 14, 1996
§ 102(e) Date: May 14, 1996

[87] PCT Pub. No.: WO96/12300
PCT Pub. Date: Apr. 25, 1996

[30] Foreign Application Priority Data

Oct. 13, 1994 [JP] Japan ............... 6-247952

[51] Int. Cl.⁶ .................... B23K 26/04; B23K 26/06
[52] U.S. Cl. .................... 219/121.67; 219/121.72; 219/121.73; 219/121.75; 219/121.83
[58] Field of Search ............... 219/121.61, 121.62, 219/121.67, 121.68, 121.69, 121.72, 121.73, 121.74, 121.75, 121.76, 121.78, 121.82, 121.83, 121.84

[56] References Cited

U.S. PATENT DOCUMENTS

| 4,911,711 | 3/1990 | Telfair et al. ............ 219/121.68 |
| 4,978,830 | 12/1990 | Millerick et al. ............ 219/121.67 |
| 5,120,926 | 6/1992 | Marriott ............ 219/121.67 |
| 5,284,477 | 2/1994 | Hanna et al. ............ 219/121.67 |
| 5,548,890 | 8/1996 | Tada et al. ............ 29/827 |

FOREIGN PATENT DOCUMENTS

| 1-224188 | 9/1989 | Japan. |
| 2-137687 | 5/1990 | Japan. |
| 3-268456 | 11/1991 | Japan. |
| 4-200886 | 7/1992 | Japan ............ 219/121.68 |
| 4-322454 | 11/1992 | Japan. |
| 5-211260 | 8/1993 | Japan. |
| 6-142968 | 5/1994 | Japan. |
| 6-142964 | 5/1994 | Japan. |
| 6-209061 | 7/1994 | Japan. |
| 6-268130 | 9/1994 | Japan. |
| 6-277861 | 10/1994 | Japan. |

*Primary Examiner*—Teresa J. Walberg
*Assistant Examiner*—Gregory L. Mills
*Attorney, Agent, or Firm*—Fay, Sharpe, Beall, Fagan, Minnich & McKee

[57] ABSTRACT

The array condition of leads (3) is detected by a photoelectric detector (41), the detection signal is subjected to signal processing to determine the timing to oscillate a pulsed laser beam, and a laser beam axis (13C) is relatively moved at a speed ($v_0$) with a work table (21) while oscillating a pulsed laser beam (13A), thereby cutting a dam bar (5). At this time, the longitudinal size of a spot (13B) of the pulsed laser beam (13A) is adjusted to be twice or more the width of the dam bar (5) by a longitudinal beam transformer (11a), the transverse size of the spot 13B is adjusted to be not less than ½ but not more than ⅘ of the length of the dam bar (5) by a transverse beam transformer (11b), and a beam rotator (11c) is appropriately operated to make the longitudinal direction of the spot (13B) substantially aligned with the longitudinal direction of the lead (3) so that the spot (13B) lies across the width ($W_1$) of the dam bar (5). As a result, the configuration after cutting the dam bar (5) becomes highly accurate and satisfactory.

5 Claims, 16 Drawing Sheets

$W_1$ : WIDTH OF DAM BAR 5

$W_2$ : LENGTH OF DAM BAR 5 (WIDTH OF SLIT 6)

$W_3$ : WIDTH OF SPOT 13B $W_4$ : LONGITUDINAL SIZE OF SPOT 13B $W_5$ : WIDTH OF CUT SLOT AFTER CUTTING DAM BAR p : LEAD PITCH $k_1, k_2$ : PROJECTING LENGTH FROM LEAD END SURFACE
(LENGTH OF DAM BAR LEFT AFTER CUTTING)

FIG.11

| SPOT SHAPE<br>AXIAL POSITION OFFSET | | CIRCULAR SPOT | ELLIPTICAL SPOT |
|---|---|---|---|
| NO X-AXIAL OFFSET OCCURS | NO Y-AXIAL OFFSET OCCURS | ○ | ◉ |
| | Y-AXIAL OFFSET OCCURS | × | ○ |
| X-AXIAL OFFSET OCCURS | NO Y-AXIAL OFFSET OCCURS | △ | △ |
| | Y-AXIAL OFFSET OCCURS | × | △ |

◉ VERY GOOD CUTTING IS POSSIBLE

○ GOOD CUTTING IS POSSIBLE
(DUE CONSIDERATION IS REQUIRED ON ALLOWABLE OFFSET VALUE FOR CONFIGURATION AFTER CUTTING)

△ SOMEWHAT POOR CUTTING
(IF OFFSET IS LARGE, LEAD FRAME PORTION IS RECESSED, RESULTING IN POOR CUTTING)

× POOR CUTTING
(JOINT PORTION CANNOT BE CUT COMPLETELY)

DAM BAR CUTTING APPARATUS AND DAM BAR CUTTING METHOD

TECHNICAL FIELD

The present invention relates to a dam bar cutting process to cut, by using a pulsed laser beam, dam bars of a lead frame in a semiconductor device wherein a semiconductor chip is mounted on the lead frame and integrally sealed by a resin mold with the lead frame, and more particularly to a dam bar cutting apparatus and method by which dam bars can be cut in the desired cut positions at high speed.

BACKGROUND ART

In a semiconductor device wherein a semiconductor chip is mounted on a lead frame and these lead frame and semiconductor chip are integrally sealed by a resin mold, dam bars connect leads of the lead frame together and serve to dam a mold resin from flowing out between the leads when the lead frame and the semiconductor chip are integrally sealed by the resin mold. The dam bars also serve to reinforce the leads. After the integral sealing by the resin mold, the dam bars are cut and removed so that the leads (outer leads) of the lead frame are separated from one another. While the semiconductor device wherein a semiconductor chip is mounted on a lead frame and these lead frame and semiconductor chip are integrally sealed by a resin mold is sometimes called a resin-molded semiconductor device, it will be referred to simply as a semiconductor device in the description below.

Heretofore, since the lead pitch of lead frames is not so fine and some margin is provided in dimensional accuracy of an outer lead portion, dam bars have been often punched and cut by using a punching press. With a recent increase in degree of integration and performance of semiconductor devices, however, lead frames have had even higher pin count and finer pitch, thus requiring more strict dimensional accuracy. Then, it has become difficult to achieve such strict dimensional accuracy by the conventional press punching method from the technical point of view.

For a high pin count, fine-pitch lead frame with the pitch of 0.3 mm, by way of example, a frame thickness is about 0.1 to 0.2 mm and a width of lead gaps (hereinafter referred to also as slits) is about 0.1 to 0.15 mm. This means that a dam bar portion requires to be cut with the comparable or finer dimensions to or than the frame thickness. Manufacturing a tool capable of punching lead frames with such fine dimensions entails a great difficulty. Even if such a tool is manufactured, it would be broken with much possibility because the tool must have a fine thickness. Further, since the resin (hereinafter referred to as within-dam resin) that has been dammed by the dam bars and the resin (hereinafter referred to as resin burrs) that have flown out over surfaces of the lead frame are deposited near the dam bars, the press punching method cannot positively cut the dam bars into satisfactory configurations.

Meanwhile, the method of cutting dam bars by utilizing a laser beam has been developed in recent years. Because a laser beam can be condensed to a very small spot suitable for fine processing, the dam bars can be cut in a non-contact manner with high dimensional accuracy just by irradiating the laser beam to the dam bars. The prior art in which such a cutting process utilizing a laser beam (hereinafter referred to also as laser cutting) is applied to cutting of dam bars is described in JP, A, 4-322454, for example.

In this prior art, the cross-section of a laser beam output from a laser oscillator is transformed into an oblong shape (elliptical shape) by a cylindrical lens, a focused position of the laser beam is determined by a galvano-mirror, and the laser beam is condensed by a large-aperture condensing lens to a dam bar for melting and cutting it. The dam bar is cut by one shot of the laser beam irradiated corresponding to a narrow slit width. (This prior art will be hereinafter referred to as first prior art).

Also, the prior art disclosed in JP, A, 5-211260 proposes a method comprising the steps of taking in cut positions of individual dam bars by a camera or the like beforehand, detecting actual positions of all the dam bars through image processing after taking in all data, and then irradiating a laser beam based on the correct position information detected. This method also employs a galvano-mirror for determining a focused position of the laser beam and a condensing lens of large aperture for condensing the laser beam. (This prior art will be hereinafter referred to as second prior art).

On the other hand, though not concerned with the dam bar cutting method, the prior art disclosed in JP, A, 1-224188 proposes a (on-the-fly) technique for relatively moving the optical axis of a laser beam along a cutting path determined beforehand, while controlling the oscillation time of the laser beam, and continuously cutting a workpiece while positioning the laser beam at high speed, for the purpose of avoiding vibration induced due to acceleration and deceleration when the workpiece is intermittently cut by the laser beam. This technique is suitable for cutting semiconductor wafers, but appears to be also applicable to cutting of dam bars. (This prior art will be hereinafter referred to as third prior art).

Further, JP, A, 6-142968 describes the prior art suitable for cutting dam bars by utilizing a laser beam. In this prior art, the presence or absence of materials in a workpiece (i.e., the array condition of leads) is optically detected by a detecting optical system (light detecting means) almost coaxially with a cutting optical system, the detection signal is changed into two value form, followed by giving a certain delay time to the square signal, and the oscillation of a laser beam is controlled based on the signal given with the delay time. In other words, this process is designed to directly visually detect the array condition of leads and to promptly irradiate a pulsed laser beam by utilizing the detected data. Thus, just by moving the optical axis of the laser beam (hereinafter referred to as laser beam axis) with respect to the workpiece, dam bars can be successively cut at high speed with certainty. (This prior art will be hereinafter referred to as fourth prior art).

DISCLOSURE OF THE INVENTION

With the first prior art, by transforming the cross-section of a laser beam into an oblong shape, the dam bar can be cut by one shot irradiation of the laser beam and, therefore, the working speed can be increased. However, since the irradiated laser beam is produced by transforming the circular cross-section of the original laser beam into the elliptical cross-section by a cylindrical lens, the input heat becomes insufficient at both end portions of an elliptical spot in the longitudinal direction thereof, i.e., at both end portions of the dam bar in the direction of width thereof, resulting in that cut edges left after cutting the dam bar are projected into a cut slot in the form of horns.

If the configurations of the cut edges left after cutting the dam bar are not satisfactory, there may occur torsional deformations or differences in amount of spring-back during subsequent bending of outer leads. This gives rise to irregular deformations and hence uneven array condition of the outer leads, leading to bonding failures in the surface mounting step. In semiconductor devices using high pin count, fine-pitch lead frames, particularly, the geometric accuracy of outer leads after bending are specified to be very strict by the Standards of EIAJ (Electronic Industries Association of Japan), for example, with the aim to avoid bonding failures in the surface mounting step. That strict configuration accuracy of outer leads cannot be satisfied if the cut edge configurations after cutting the dam bar are not satisfactory as mentioned above.

Meanwhile, in semiconductor devices, a resin mold portion is subject to considerable shrinkage deformation when a lead frame and a semiconductor chip are sealed by a resin mold. Therefore, deformation differences in the plane of the lead frame between a dam bar portion near the resin mold, a lead portion extending outwardly of the dam bar portion, and an outer frame portion connecting leads together outwardly of the lead portion are so increased as to invite considerable relative deformations between the dam bar portion and the remaining portions outside it. This gives rise to undulations (wave-like folds) in the outer lead portion and the outer frame portion. For high pin count, fine-pitch lead frames which have a thin frame thickness and a narrow lead width and hence have low rigidity, particularly, the effect of the above-mentioned shrinkage deformation occurred during the resin molding step is not negligible. Also, even if there occurs very small deformation for each of the leads, the deformation is accumulated one by one of many leads to eventually produce a large error as a whole. Stated otherwise, it may happen that even if the dimensional accuracy is fairly high and kept in the allowable error range for each of the leads, the allowable error range may be exceeded for the entirety of leads due to accumulation of individual errors.

Accordingly, when cutting dam bars in accordance with the second prior art stated above, even if the actual positions of individual dam bars have been detected beforehand, the positions where the dam bars are to be cut may change and precise cutting of the dam bars may no longer be achieved because of the fact that strains having occurred with the shrinkage deformation of the resin mold portion are released during cutting of the dam bars to thereby bring about a phenomenon called buckling in which out-of-plane deformations produced in the dam bar portion and the remaining portions outside it are abruptly reversed in direction therebetween (i.e., a phenomenon ascribed to an abrupt reversing of out-of-plane buckling deformations).

Further, since the third prior art is not concerned with the dam bar cutting method, it of course includes no mechanism for detecting the positions of dam bars. When applying the third prior art to cutting of the dam bars, therefore, the positions where the dam bars are to be cut may deviate and the dam bars may be cut at false positions if the lead frame deforms with the shrinkage deformation of the resin mold portion. Additionally, this case also accompanies a fear of bringing about buckling as with the above second prior art.

With the fourth prior art, since a pulsed laser beam is irradiated while directly detecting the array condition of leads, the pulsed laser beam can be surely irradiated to the desired cut positions, i.e., the dam bars to be cut, by properly selecting the delay time even if the lead frame deforms with the shrinkage deformation of the resin mold portion. The process of moving a workpiece while moving the detected position in the direction of advance of the workpiece, and cutting the dam bars successively by the pulsed laser beam based on the detection signal like this prior art can provide high detection accuracy in the direction of movement of the workpiece, i.e., in the direction perpendicular to the longitudinal direction of the lead, and can sufficiently achieve satisfactory cutting accuracy in that direction. However, since the detected position is not moved in the longitudinal direction of the lead, it is difficult to ensure high positioning accuracy in that direction. Accordingly, if the laser beam axis deviates relatively in the longitudinal direction of the lead with deformation of the lead frame ascribed to the shrinkage deformation of the resin mold portion or any other reason, the configurations of cut edges left after cutting the dam bar become unsatisfactory and, in some cases, the dam bar may not be cut completely.

An object of the present invention is to provide a dam bar cutting apparatus and method for cutting dam bars by irradiating a pulsed laser beam to desired cut positions based on the result of detecting the array condition of leads, which apparatus and method can ensure highly accurate and satisfactory configurations after cutting the dam bars.

To achieve the above object, according to the present invention, there is provided a dam bar cutting apparatus for irradiating a pulsed laser beam to dam bars of a lead frame in a semiconductor device and cutting the dam bars successively, the dam bar cutting apparatus comprising a laser oscillator for oscillating a pulsed laser beam, a cutting optical system for guiding the pulsed laser beam to the cut position of a workpiece, a work nozzle for emitting the pulsed laser beam guided by the cutting optical system therethrough and being provided at its tip end with an opening for ejecting assist gas therethrough, carriage means for relatively moving an optical axis of the pulsed laser beam at a constant speed with respect to the workpiece, detection light generating means for irradiating detection light to each of the dam bars to be cut and thereabout on the lead frame, light detecting means for receiving the detection light reflected by the lead frame and generating a corresponding detection signal, and control means for determining the timing to irradiate the pulsed laser beam based on the detection signal from the light detecting means and controlling the laser oscillator so that the pulsed laser beam is irradiated to a predetermined position on the dam bar, wherein the dam bar cutting apparatus further comprises longitudinal beam transforming means for transforming the pulsed laser beam oscillated from the laser oscillator into a pulsed laser beam having an oblong cross-sectional shape so that the longitudinal size of a spot of the pulsed laser beam on the dam bar is twice or more the width of the dam bar, transverse beam transforming means for transforming the pulsed laser beam so that the transverse size of the spot of the pulsed laser beam on the dam bar is not less than ½ but not more than ⅘ of the length of the dam bar, and beam rotating means for rotatively displacing the spot about the optical axis of the pulsed laser beam.

In the present invention thus arranged, the detection light is irradiated by the detection light generating means to the dam bar to be cut and thereabout on the lead frame while moving the workpiece at the predetermined speed by the carriage means, the reflected light is detected by the light detecting means, and the light detecting means generates the detection signal depending on the array condition of the leads (i.e., the presence or absence of the leads). The detection signal is sent to the control means which determines the timing to irradiate the pulsed laser beam based on the detection signal, and controls the laser oscillator to oscillate the pulsed laser beam at that timing. The pulsed laser beam is thereby irradiated to the predetermined position on the dam bar in accordance with the array condition of the leads. At this time, while the laser beam axis is relatively moved at the predetermined speed by the carriage means with respect to the workpiece, the irradiation time of the pulsed laser beam (hereinafter referred to as the pulse width) is very short and the distance through which the laser beam axis relatively moves during the pulse width is very small. Accordingly, by moving the laser beam axis relative to the workpiece, the irradiated position is uniquely determined in accordance with the oscillation time of the pulsed laser beam, and the dam bars are successively cut at high speed with certainty.

On the contrary, in the first and second prior arts explained before, because the condensed position of a laser beam is determined by using a galvano-mirror and the laser beam is condensed by using a condensing lens of large aperture, it is difficult from the structural point of view to cut the corresponding dam bar by the pulsed laser beam while detecting the array condition of the leads, as with the present invention.

Furthermore, in the present invention, the pulsed laser beam oscillated from the laser oscillator is transformed by the longitudinal beam transforming means into the pulsed laser beam having an oblong cross-sectional shape. At this time, the longitudinal size of the oblong spot on the dame bar is adjusted to be twice or more the width of the dam bar. Accordingly, input heat is so sufficiently applied to both end portions of the dam bar in the direction of width thereof that opposing cut edges left after cutting the dam bar will not be projected into a cut slot in the form of horns, but extend substantially parallel to each other.

Also, even with the opposing cut edges left after cutting the dam bar extending substantially parallel to each other, if the width of the cut slot is too narrow, the projecting portions from side walls of the leads, i.e., the remaining dam bars left after the cutting, would be too large. Avoiding this requires it to limit the transverse size of the oblong spot on the dam bar as well. In the present invention, the pulsed laser beam is transformed by the transverse beam transforming means so that the transverse size of the spot is not less than ½ but not more than ⅘ of the length of the dam bar. The transverse size of the spot is thereby limited to lessen the projecting portions from the lead side walls.

For ensuring the dimensional accuracy of the lead array condition of lead frames, of the configuration after cutting the dam bar, the projecting length from each lead side wall (i.e., the length of the remaining dam bar left after the cutting) and the width of the cut slot after cutting the dam bar are particularly specified. The EIAJ Standards require the former to be not less than 0 but not more than ⅕ of the width of a slit, and the latter to be not less than ½ of the width of the dam bar. From those limit conditions on the configuration after cutting the dam bar, it is possible to infer the dimensional conditions for the spot of the pulsed laser beam transformed by the longitudinal beam transforming means and the transverse beam transforming means. As stated above, by properly adjusting the irradiated position of the pulsed laser beam provided that the longitudinal size of the spot is set to be twice or more (preferably, three or more times) the width of the dam bar and the width of the spot is set to be not less than ½ but not more than ⅘ of the width of the slit, adverse effects upon the configuration after cutting the dam bar due to the insufficient input heat in both end portions of the spot in the direction of length thereof can be eliminated and the above-mentioned Standards can be substantially satisfied even if materials and lead dimensions are varied case by case. Conversely, if the spot dimensions are out of the above proper conditions, the satisfactory configuration after cutting the dam bar cannot be achieved by one shot irradiation of the pulsed laser beam.

Further, by rotatively displacing the pulsed laser beam about its optical axis appropriately by the beam rotating means, the longitudinal direction of the spot can be set to be substantially aligned with the longitudinal direction of the lead so that the spot lies across the width of the dam bar.

As a result, the dam bar can be cut in the direction of width thereof by one shot irradiation of the pulsed laser beam to provide a highly accurate and satisfactory configuration after cutting the dam bar.

Moreover, in the process of cutting the dam bars successively while moving the workpiece, as stated above, the detection accuracy in the direction of movement of the workpiece, i.e., in the direction perpendicular to the longitudinal direction of the lead, that is to say, the irradiation positioning accuracy in the direction of movement of the laser beam axis, is high and the cutting accuracy in the direction perpendicular to the longitudinal direction of the lead can be sufficiently achieved. Additionally, in the present invention, the pulsed laser beam having an oblong cross-sectional shape is employed with the longitudinal size of the spot thereof set to be long as mentioned above, and the longitudinal direction of the spot is made substantially aligned with the longitudinal direction of the lead. Therefore, no significant problems arise even if the positioning accuracy of the laser beam axis in the longitudinal direction of the lead is not so high. Thus, even if the laser beam axis deviates a little relatively in the longitudinal direction of the lead with deformation of the lead frame ascribed to the shrinkage deformation of the resin mold or any other reason, it is possible to surely cut the dam bar in the direction of width thereof by one shot irradiation.

In the above dam bar cutting apparatus, preferably, the light detecting means receives the detection light reflected by the lead frame and passed through the opening of the work nozzle. With this feature, most of sputters, disturbance light, extraneous dirt and dust, etc. is blocked by the work nozzle and, therefore, the light detecting means is protected. Further, since the lead array condition in a position immediately prior to the laser beam axis is detected and the pulsed laser beam is irradiated at once to cut the dam bar, disturbance elements are less apt to enter the system from the exterior during the period from the detection to the cutting and hence the arrangement is suitable for fine dimension working.

When detecting the array condition of the leads (i.e., the presence or absence of the leads) based on the detection light as stated above, it is advantageous to arrange means for detecting the detection light at a place sufficiently remote from the position to be detected on the lead frame (hereinafter referred to as the detected position). From this point of view, a photoelectric detector for converting change in the intensity of incident light into an electric signal and outputting the electric signal is suitable as the light detecting means. The use of such a photoelectric detector enables the detection light to be captured at the sufficiently remote place through the opening of the work nozzle.

Also, preferably, the above dam bar cutting apparatus further comprises monitoring image pick-up means for picking up an image of the dam bar and thereabout through the opening at the tip end of the work nozzle, and monitoring image display means for simultaneously displaying the optical axis of the pulsed laser beam irradiated on the dam bar and the irradiated position of the detection light from the detection light generating means on the image picked up by the monitoring image pick-up means. With this arrangement, an image of the dam bar and thereabout is picked up by the monitoring image pick-up means through the opening at the tip end of the work nozzle, and the optical axis of the pulsed laser beam irradiated to the dam bar and the irradiated position of the detection light from the detection light generating means, i.e., the detected position, are simultaneously displayed on the same image by the monitoring image display means. Accordingly, it is possible to easily confirm, adjust and manage the mount condition of a semiconductor device as the workpiece, the cutoff start position and the cutting path of the dam bars, as well as the optical axis of the pulsed laser beam and the detected position during the cutting of the dam bars, while looking at the displayed image. Further, with the above arrangement, the working result obtained after cutting the dam bars by irradiation of the laser beam can be observed to determine the processing conditions and inspect the processing quality.

To achieve the above object, according to the present invention, there is provided a dam bar cutting method for irradiating a pulsed laser beam from a laser oscillator to dam bars of a lead frame in a semiconductor device while relatively moving an optical axis of the pulsed laser beam at a predetermined speed with respect to the semiconductor device, thereby cutting the dam bars successively, the dam bar cutting method comprising the steps of irradiating detection light to each of the dam bars to be cut and thereabout on the lead frame, receiving the detection light reflected by the lead frame and generating a corresponding detection signal, determining the timing to irradiate the pulsed laser beam based on the detection signal, and controlling oscillation of the pulsed laser beam so that the pulsed laser beam is irradiated at the timing to a predetermined position on the dam bar, wherein the dam bar cutting method further comprises the steps of transforming the pulsed laser beam oscillated from the laser oscillator into a pulsed laser beam having an oblong cross-sectional shape so that the longitudinal size of a spot of the pulsed laser beam on the dam bar is twice or more the width of the dam bar, transforming the pulsed laser beam so that the transverse size of the spot of the pulsed laser beam on the dam bar is not less than ½ but not more than ⅘ of the length of the dam bar, rotatively displacing the spot about the optical axis of the pulsed laser beam so that the longitudinal direction of the spot is substantially aligned with the longitudinal direction of the lead, and irradiating the pulsed laser beam so that the spot lies across the dam bar in the direction of width thereof.

BRIEF DESCRIPTION OF THE DRAWINGS

FIG. 5 is a view showing a workpiece, i.e., a semiconductor device in which.

FIG. 10 is a view showing effects upon the configuration after the cutting resulted from position offsets of spots in the X- and Y-axis directions when the dam bars are cut in which.

FIG. 11 is a table summarizing the effects upon the configuration after the cutting resulted from position offsets in the X- and Y-axis directions when the dam bars are cut by using the circular spot and the elliptical spot.

FIG. 16 is a view looking at, from the outer lead side, the semiconductor device with the outer leads after being bent in the case that the configurations of cut edges left after cutting the dam bars are not satisfactory in which.

BEST MODE FOR CARRYING OUT THE INVENTION

One embodiment of a dam bar cutting apparatus and method according to the present invention will be hereinafter described with reference to FIGS. 1 to 16.

Figure 1:
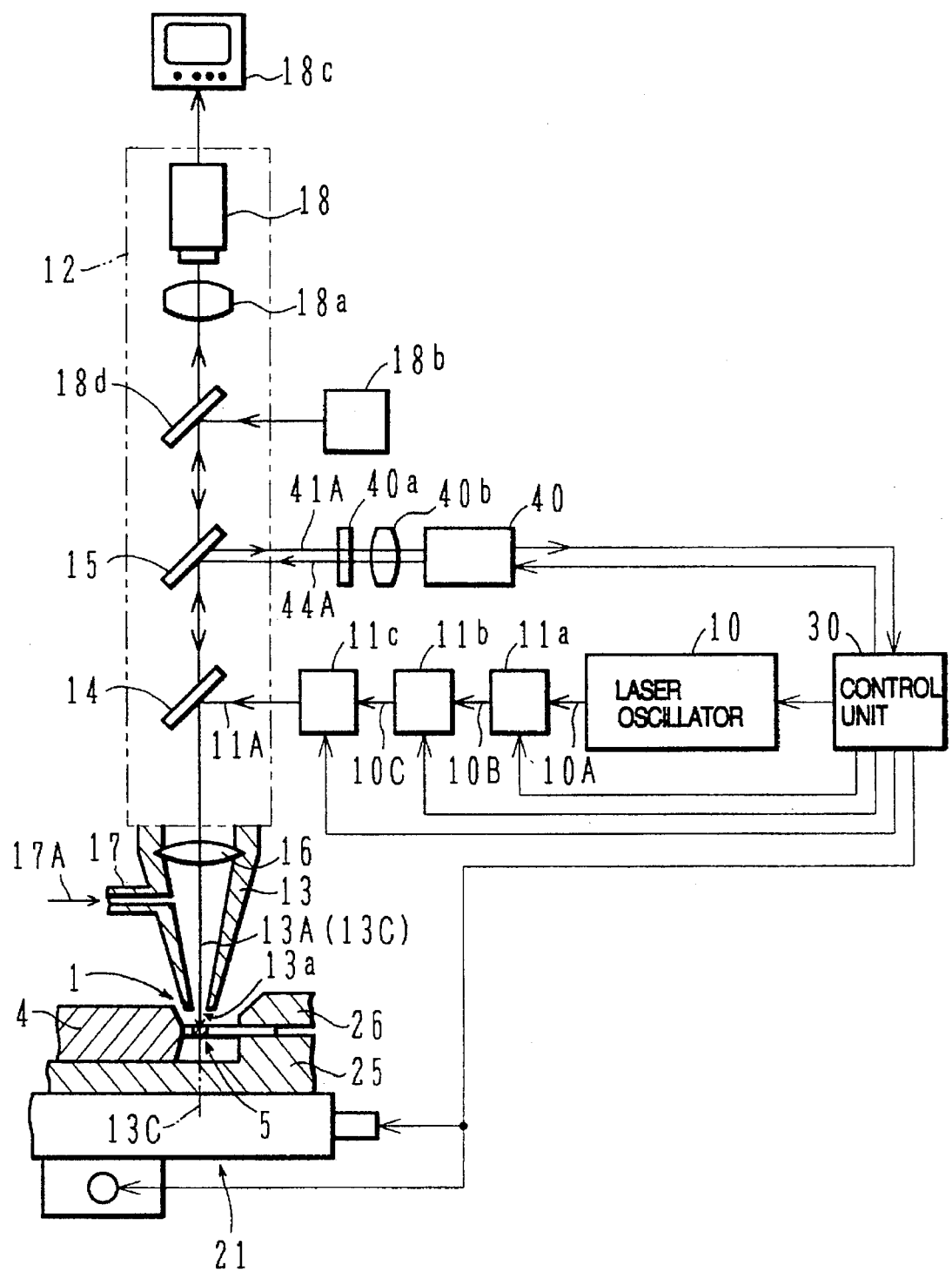
FIG. 1 is a block diagram showing the general arrangement of a dam bar cutting apparatus, part of which structure is schematically shown, according to one embodiment of the present invention.

FIG. 1 is a block diagram showing the general arrangement of a dam bar cutting apparatus, part of which structure is schematically shown, according to this embodiment. As shown in FIG. 1, the dam bar cutting apparatus of this embodiment comprises a laser oscillator 10, a longitudinal beam transformer 11a as longitudinal beam transforming means, a transverse beam transformer 11b as transverse beam transforming means, a beam rotator 11c as beam rotating means, a work head 12, a work nozzle 13, a work table 21 as carriage means, a control unit 30, and a detecting unit 40. The work head 12 comprises a dichroic mirror 14, a detection half-mirror 15, and a camera half-mirror 18d. The work head 12 also includes a TV camera 18, a camera focusing lens 18a, and a camera light source 18b with a monitor TV 18c connected to the TV camera 18. The work nozzle 13 includes a condensing lens 16 and an assist gas supply port 17. A band-pass filter 40a allowing only light of required wavelength to selectively pass therethrough and a detection focusing lens 40b are attached to the detecting unit 40.

Figure 2:
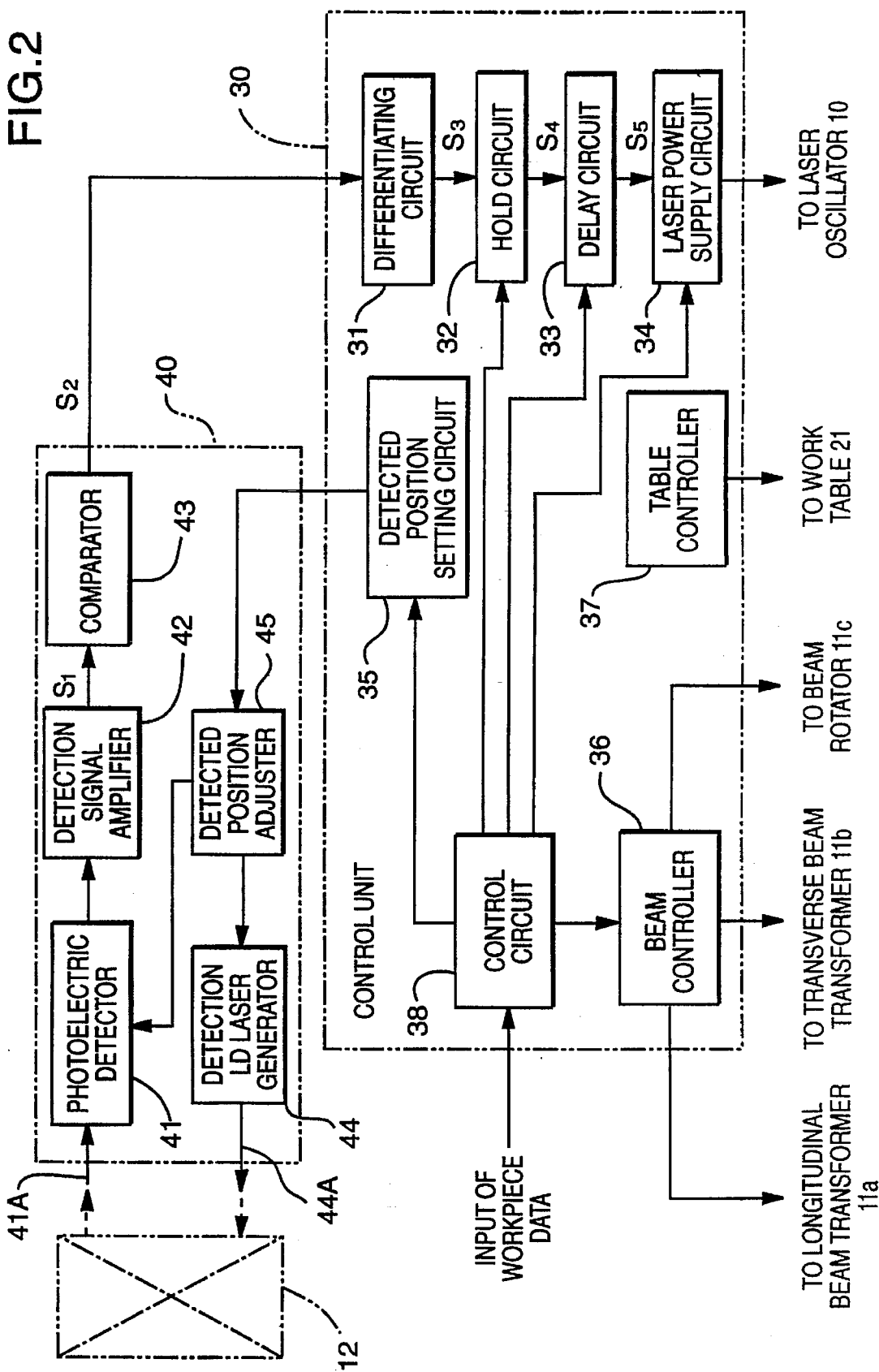
FIG. 2 is a block diagram showing the arrangement of a control unit and a detecting unit in the dam bar cutting apparatus of FIG. 1.

Also, as shown in FIG. 2, the control unit 30 comprises a differentiating circuit 31, a hold circuit 32, a delay circuit 33 as delay means, a laser power supply circuit 34, a detected position setting circuit 35, a beam controller 36, a table controller 37, and a control circuit 38. Further, the detecting unit 40 comprises a photoelectric detector 41, a detection signal amplifier 42, a comparator 43 as comparing means, a laser diode for detection (LD) 44, and a detected position adjuster 45.

Figure 3:
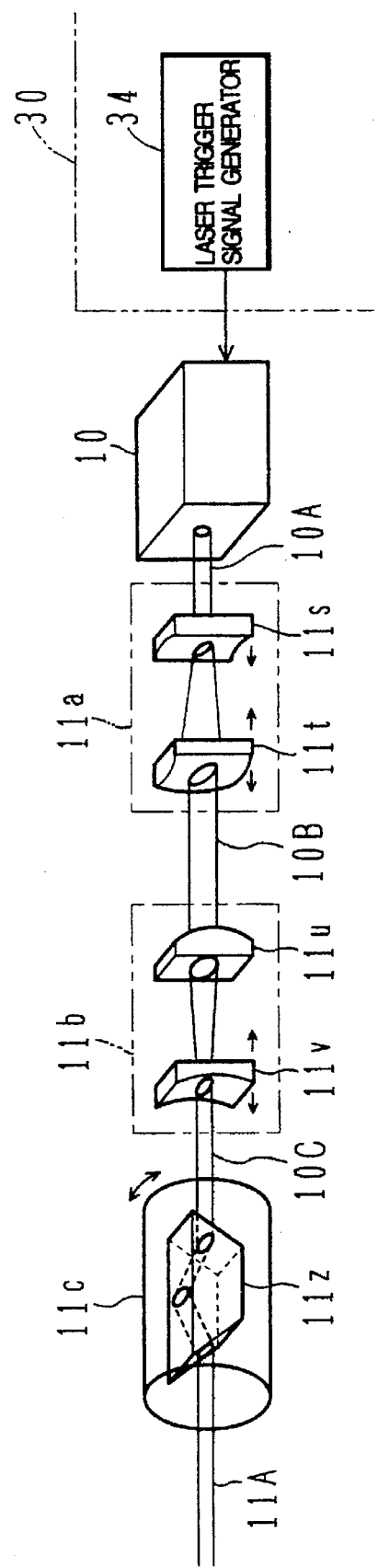
FIG. 3 is a diagram showing the arrangement of a longitudinal beam transformer 11a, a transverse beam transformer 11b, and a beam rotator 11c.

As shown in FIG. 3, the longitudinal beam transformer 11a comprises a convex cylindrical lens 11s and a concave cylindrical lens 11t for transforming the cross-section of a pulsed laser beam 10A from the laser oscillator 10 into an elongate elliptical shape. The transverse beam transformer 11b comprises a convex cylindrical lens 11u and a concave cylindrical lens 11v for further transforming the cross-section of a pulsed laser beam 10B from the longitudinal beam transformer 11a into a predetermined cross-sectional shape. The direction in which the convex cylindrical lens 11u and the concave cylindrical lens 11v have each the maximum curvature is perpendicular to the direction in which the convex cylindrical lens 11s and the concave cylindrical lens 11t have each the maximum curvature.

In the longitudinal beam transformer 11a, by moving the concave cylindrical lens 11t along the optical axis indicated by arrows in FIG. 3, the spacing between the convex cylindrical lens 11s and the concave cylindrical lens 11t is adjusted so as to change the longitudinal size of the elliptical cross-section of the laser beam. In the transverse beam transformer 11b, by moving the concave cylindrical lens 11v along the optical axis indicated by arrows in FIG. 3, the spacing between the convex cylindrical lens 11u and the concave cylindrical lens 11v is adjusted so as to change the transverse size of the elliptical cross-section of the laser beam. Incidentally, the transverse beam transformer 11b may be disposed nearer to the laser oscillator 10 than the longitudinal beam transformer 11a. Also, the transverse beam transformer 11b may comprise a pair of normal convex lens and a normal concave lens instead of the convex cylindrical lens 11u and the concave cylindrical lens 11v.

The beam rotator 11c includes, as shown in FIG. 3, an image rotating prism 11z (called also a Dove prism) for rotating a pulsed laser beam 10C, of which cross-section has been transformed into the elongate elliptical shape by the longitudinal beam transformer 11a and the transverse beam transformer 11b, a predetermined angle about its optical axis as indicated by arrow in the figure. Here, the image rotating prism 11z is an optical member functioning such that when it is rotated a certain angle about the optical axis by a not-shown rotating mechanism, incident light is rotated twice as large as the above angle about the optical axis. The adjustment of the longitudinal beam transformer 11a, the transverse beam transformer 11b, and the beam rotator 11c is made by the beam controller 36.

The work nozzle 13 is attached to the work head 12 with its center axis being vertical to a workpiece 1 to be cut (i.e., a semiconductor device in which a semiconductor chip is mounted on a lead frame and these components are integrally sealed by a resin mold). The workpiece 1 is rested on a fixing jig 25 and retained at its outer lead portion by a retaining jig 26, the fixing jig 25 being in turn mounted on the work table 21.

Figure 4:
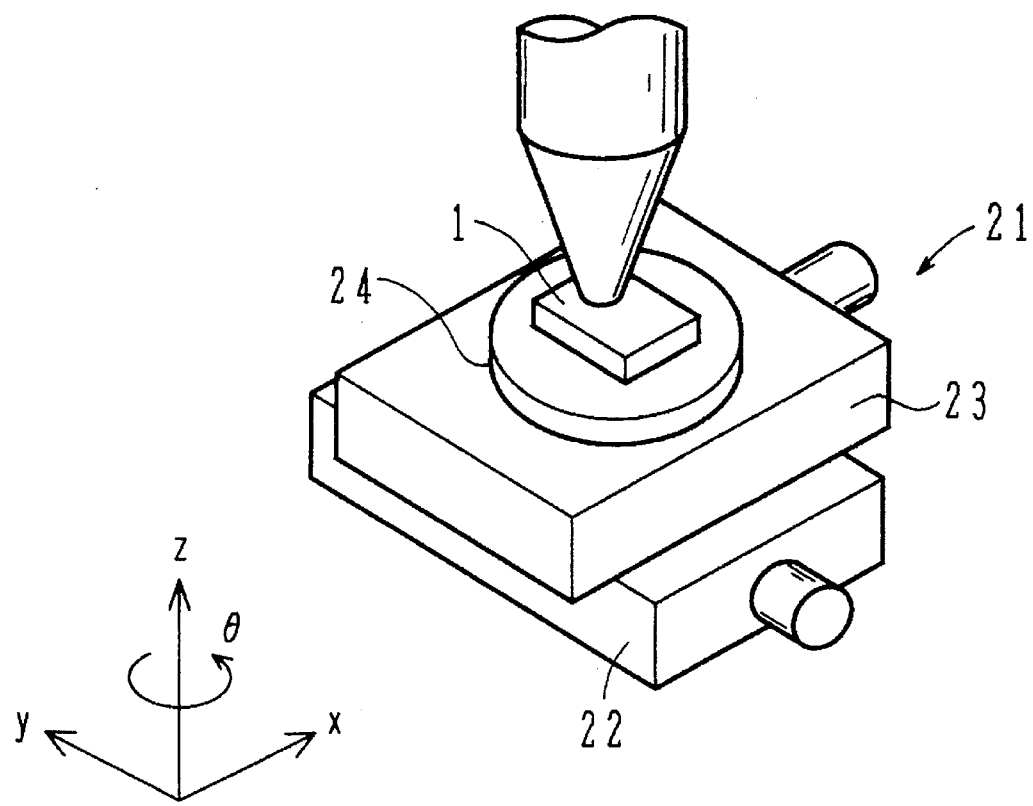
FIG. 4 is a view showing the construction of a work table shown in FIG. 1.

The work table 21 moves the workpiece 1 in a horizontal plane (this plane being assumed to be an XY-plane) in accordance with a command from the table controller 37. As shown in FIG. 4, the work table 21 consists of an X-table 22, a Y-table 23, and a θ-table 24. In the normal dam bar cutting process, the workpiece 1 is moved with respect to a laser beam axis 13C by the X- table 22 and the Y-table 23. The θ-table 24 is used to correct an error of the rotational angle in the XY-plane among errors occurred in the mount position of the workpiece 1 after mounting the workpiece 1 onto the work table 21. In other words, the center line of the dam bar 5 in the longitudinal direction is substantially aligned with the X- or Y-axis. This setting makes it possible to reduce the number of axes to be controlled when cutting the dam bar 5, and hence to carry out the working with high dimensional accuracy under control in the uniaxial direction, i.e., in the feed direction.

Returning to FIGS. 1 and 2, in the above-mentioned arrangement, the pulsed laser beam 10A is emitted from the laser oscillator 10 under control of the laser power supply circuit 34 (see FIG. 2). Then, a pulsed laser beam 11A entering the work head 12 through the longitudinal beam transformer 11a, the transverse beam transformer 11b, and the beam rotator 11c is changed in its direction by the dichroic mirror 14 and condensed by the condensing lens 16 into a pulsed laser beam 13A which passes through an opening 13a at the tip end of the work nozzle 13 for irradiation to the workpiece 1.

Further, detection light 44A emitted from the LD 44 in the detecting unit 40 also passes through the opening 13a at the tip end of the work nozzle 13. The light reflected by the surface of the workpiece 1 at the detected position passes through the opening 13a again to become detection light 41A which enters the photoelectric detector 41. Just before entering the photoelectric detector 41, a useless wavelength region of the detection light 41A is eliminated by the band-pass filter 40a, following which the filter-passed light is focused by the detection focusing lens 40b. Since the detection light 41A having passed through the opening 13a is captured by the photoelectric detector 41 as explained above, most of sputters, disturbance light, extraneous dirt and dust, etc. is blocked by the work nozzle 13 and, therefore, the photoelectric detector 41 is protected. Also, with the detection laser beam used as the detection light, rising (response) of the detection signal (see FIG. 8) is sharpened and highly accurate detection with high resolution can be achieved.

In the photoelectric detector 41, change in the intensity of the entering detection light 41A is converted into an electric detection signal including information on the surface of the workpiece 1, i.e., information indicating the presence or absence (array condition) of leads near dam bars in a semiconductor device. The signal output from the photoelectric detector 41 is sent to the detection signal amplifier 42 for amplification. The amplified signal is sent to the comparator 43 for binary coding, and the binary-coded signal is input to the differentiating circuit 31 in the control unit 30. A pulsed laser beam is oscillated through subsequent signal processing, but the signal processing subsequent to the photoelectric detector 41 will be described later in detail. Thus, since the lead array condition in a position immediately prior to the laser beam axis 13C is detected and the pulsed laser beam is irradiated at once to cut the dam bar, disturbance elements are less apt to enter the system from the exterior during the period from the detection to the cutting and hence the arrangement is suitable for fine dimension working.

Also, the adjustment of the detected position on the workpiece 1 is made by adjusting the photoelectric detector 41 and the LD 44 by the detected position adjuster 45. The detected position adjuster 45 is in turn controlled by the detected position setting circuit 35 in the control Unit 30. While the actual structure for installation of the photoelectric detector 41 and the LD 44 is not shown in detail in FIG. 2, the compact structure can be realized by, for example, installing the photoelectric detector 41 around the LD 44 in concentric relation.

Assist gas 17A supplied through the assist gas supply port 17 is ejected toward the workpiece 1 from the opening 13a of the work nozzle 13. Rather than being limited to this embodiment, the assist gas 17A is generally used in a laser cutting process to melt and cut a workpiece in order to achieve satisfactory working by blowing off most of molten materials with the gas.

Data of the semiconductor device (workpiece) 1 to be cut, such as design values of the semiconductor device and the dam bars, the path along which the dam bars are to be cut, the oscillation and energy conditions of the pulsed laser beam, for example, are externally input to the control circuit 38 in the control unit 30. Further, the differentiating circuit 31, the hold circuit 32, the delay circuit 33, the laser power supply circuit 34, the detected position setting circuit 35, the beam controller 36, and the table controller 37 are controlled by the control circuit 38.

Next, a description will be made of the operation of cutting dam bars along one side of the semiconductor device by the dam bar cutting apparatus constructed as explained above.

Figure 5A:
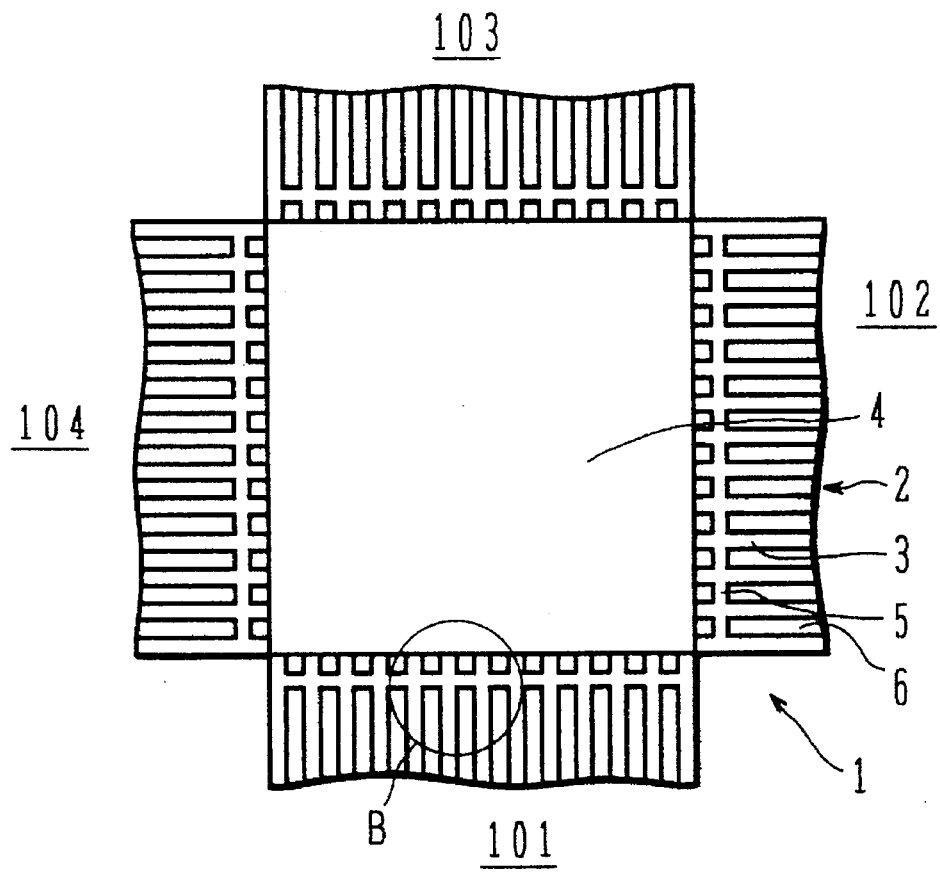
FIG. 5(a) is a plan view and FIG. 5(b) is an enlarged view of part B in FIG. 5(a).

The structure of the workpiece 1, i.e., the semiconductor device, will be first described with reference to FIG. 5(a). In FIG. 5(a), the semiconductor device 1 is formed by mounting a semiconductor chip (not shown) on a lead frame 2, electrically interconnecting between corresponding terminals by gold wires or the like, and then integrally sealing the semiconductor chip and the lead frame by a resin mold 4. Dam bars 5 are present between adjacent leads 3 of the lead frame 2 to not only prevent a resin from flowing out between the leads during the molding process by the resin mold 4, but also reinforce the individual leads 3. In this embodiment, the dam bars 5 are cut and removed by the above-stated dam bar cutting apparatus. The semiconductor device 1 shown in FIG. 5(a) has the dam bars 5 not yet cut. Strictly speaking, the illustrated semiconductor device 1 is in the course of the manufacture stage, but such one in the course of the manufacture stage will also be referred to as a semiconductor device in the present invention for the sake of brevity.

Figure 5B:
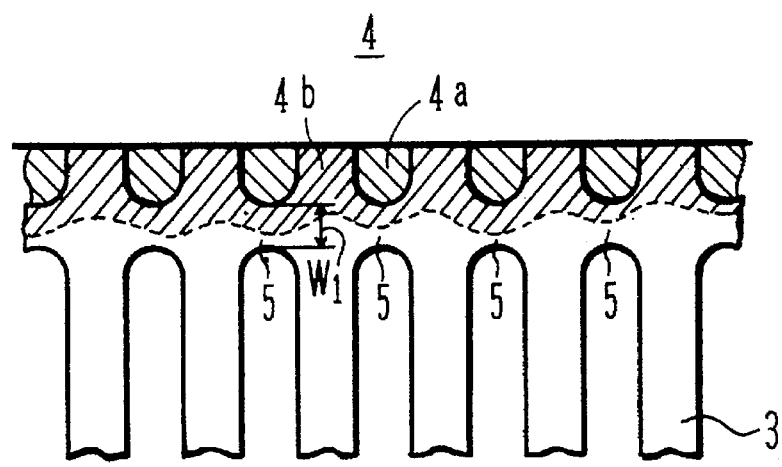

FIG. 5(b) is an enlarged view of part B in FIG. 5(a). Near the dam bars 5, there deposit a within-dam resin 4a dammed by the dam bars 5 and resin burrs 5 resulted from the resin flowing out over surfaces of the lead frame 2 and hardened there.

Figure 6:
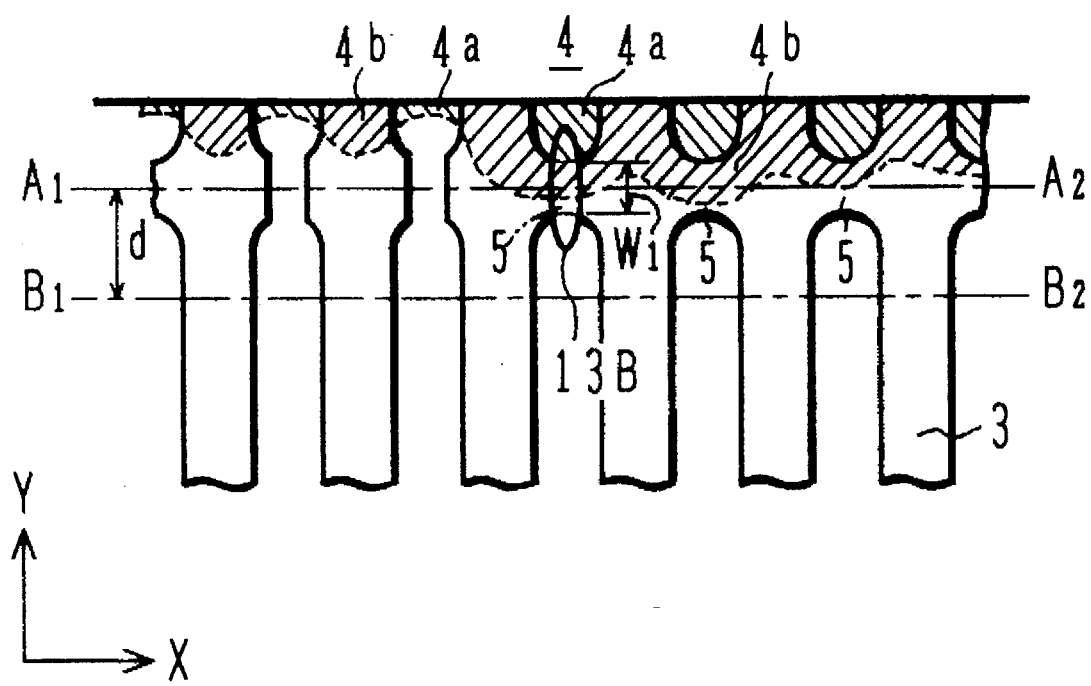
FIG. 6 is a view for explaining a process of cutting dam bars, the view showing the same part as FIG. 5(b).

FIG. 6 is a view for explaining a process of cutting the dam bars 5, the view showing the same part as FIG. 5(b). When cutting the dam bars 5, the workpiece 1 is moved with the work table 21, causing the position of the work nozzle 13 with respect to the workpiece 1 to be relatively moved at a constant speed $v_0$ in the positive direction of the X-axis, for example. Note that the X- and Y-axes are defined as shown.

The longitudinal beam transformer 11a is appropriately operated so that a spot 13B formed in the irradiated position of the pulsed laser beam 13A has a longitudinal size twice or more the width $W_1$ of the dam bar 5 (the longitudinal size of the spot 13B being described later in detail), as shown in FIG. 6. A transverse size of the spot 13B is also controlled by the transverse beam transformer 11b. Further, the beam rotator 11c is operated to make the longitudinal direction of the spot 13B substantially aligned with the longitudinal direction of the lead 3 so that the spot 13B lies across the width $W_1$ of the dam bar 5. This enables the dam bar 5 to be cut in the direction of width thereof by one shot irradiation of the pulsed laser beam 13A. In addition, since the longitudinal size of the spot 13B is adjusted to be sufficiently long as mentioned above, both end portions of the dam bar 5 in the direction of width thereof are subject to a sufficient amount of input heat, resulting in that cut edges left after cutting the dam bar will not be projected at their both end portions into the cut slot in the form of horns and the cut slot after cutting the dam bar can have a highly accurate and satisfactory configuration. Moreover, as shown in FIG. 6, most of the within-dam resin 4a is removed with the input heat applied upon irradiation of the pulsed laser beam 13A, and the resin burrs 4b are also greatly reduced in size.

In the above process, to carry out the cutting of the dam bar in satisfactory fashion, the laser beam axis 13C must be relatively moved on the center line of the dam bar 5 in the longitudinal direction, i.e., on a path $A_1$–$A_2$. However, because there is no configuration change on the path $A_1$–$A_2$ under the condition where any dam bars are not yet cut, it is impossible to detect the array condition of the leads along that path. With this in mind, by moving the photoelectric detector 41 along a path $B_1$–$B_2$ which is a little (distance d) away from the path $A_1$–$A_2$, the array condition of the leads can be detected.

In this respect, end surfaces of the leads 3 near the dam bars 5 often have curved portions with a certain curvature, and these curved portions may affect the detection of the lead array condition. It is therefore desired that the path $B_1$–$B_2$ of the detected position P is set out of interference with the curved portions and intersects at least parallel edges of the leads. Further, since the presence of the within-dam resin 4a and the resin burrs 4b on the side of the dam bars 5 nearer to the resin mold 4 may affect the detection accuracy, it is more desired to set the path of the detected position on the side of the dam bars 5 nearer to not the resin mold 4 but the outer leads like this embodiment.

During the above process of cutting the dam bars 5 or the preparation stage prior to the cutting, an image of the dam bar 5 and thereabout is picked up by the TV camera 18 through the opening 13a at the tip end of the work nozzle 13 and is displayed on the monitor TV 18c. At this time, illumination light from the camera light source 18b is irradiated to the dam bar 5 and thereabout through the camera half-mirror 18d, and the light reflected from the dam bar 5 and thereabout is taken by the TV camera 18 through the camera focusing lens 18a.

Figure 7A:
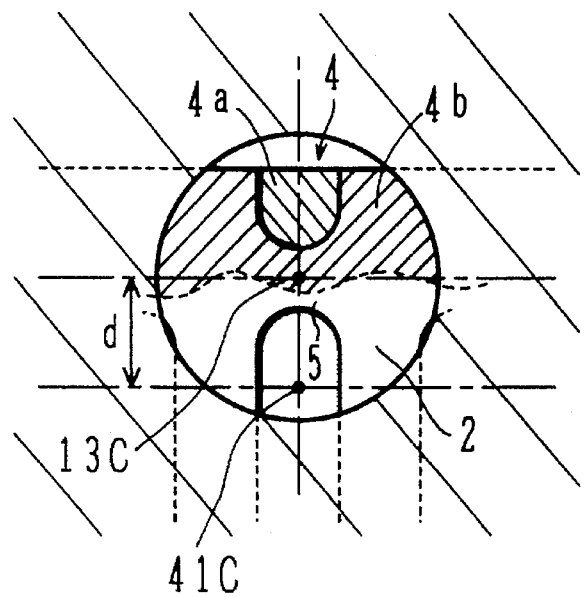
FIG. 7(a) is an illustration showing an image of one dam bar and thereabout observed through an opening of a work nozzle.

FIG. 7(a) shows an image of the dam bar 5 and thereabout observed through the opening 13a of the work nozzle 21. As shown in FIG. 7(a), the observable region is limited by a side wall of the work nozzle 13, but the dam bar 5 and the array condition of the leads 2 can be monitored through the opening 13a of the work nozzle 13. Note that the area outside a circle in the figure represents the not-observable region concealed by the side wall of the work nozzle 13. Also, the laser beam axis 13C and the detected position 41C captured by the photoelectric detector 41 are simultaneously indicated on the same image. This makes it possible to easily confirm, adjust and manage the mount condition of the workpiece 1, the cutoff start position and the cutting path 6f the dam bars 5, as well as the laser beam axis 13C and the detected position 41C during the cutting of the dam bars 5, while looking at the monitor TV 18c.

Figure 7B:
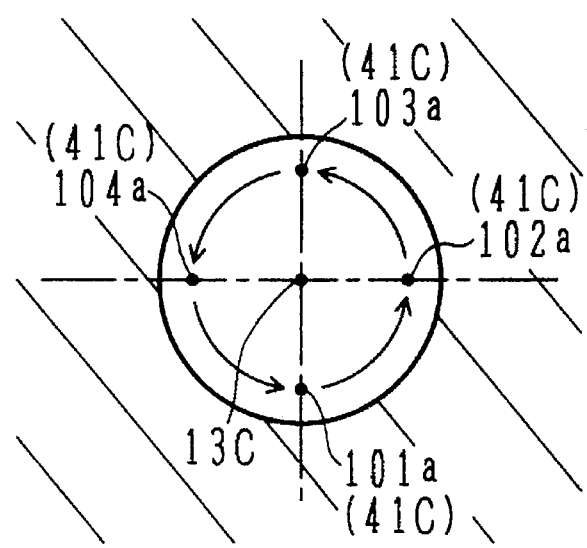
FIG. 7(b) is an illustration showing a manner of appropriately moving the detected position depending on the direction of advance of the working.

Further, the detected position 41C on the lead frame 2 captured by the photoelectric detector 41 can be appropriately moved depending on the direction of advance of the working as shown in FIG. 7(b). For example, when cutting the dam bars 5 along one side 101 in FIG. 5(a) among four sides of the lead frame 2 (corresponding to the case shown in FIGS. 6 and 7(a)), the detected position 41C may be adjusted to be aligned with the direction of 6 o'clock, i.e., the position denoted by 101a, in FIG. 7(b). Likewise, the detected position 41C may be adjusted to be aligned with the direction of 3 o'clock, i.e., the position denoted by 102a, when cutting the dam bars 5 along a side 102 in FIG. 5(a), the direction of 12 o'clock, i.e., the position denoted by 103a, when cutting the dam bars 5 along a side 103, and the direction of 9 o'clock, i.e., the position denoted by 104a, when cutting the dam bars 5 along a side 104, respectively.

The detection signal output from the photoelectric detector 41 is sent to the detection signal amplifier 42 for amplification. The subsequent signal processing will now be described with reference to FIGS. 1, 2 and 8.

Figure 8:
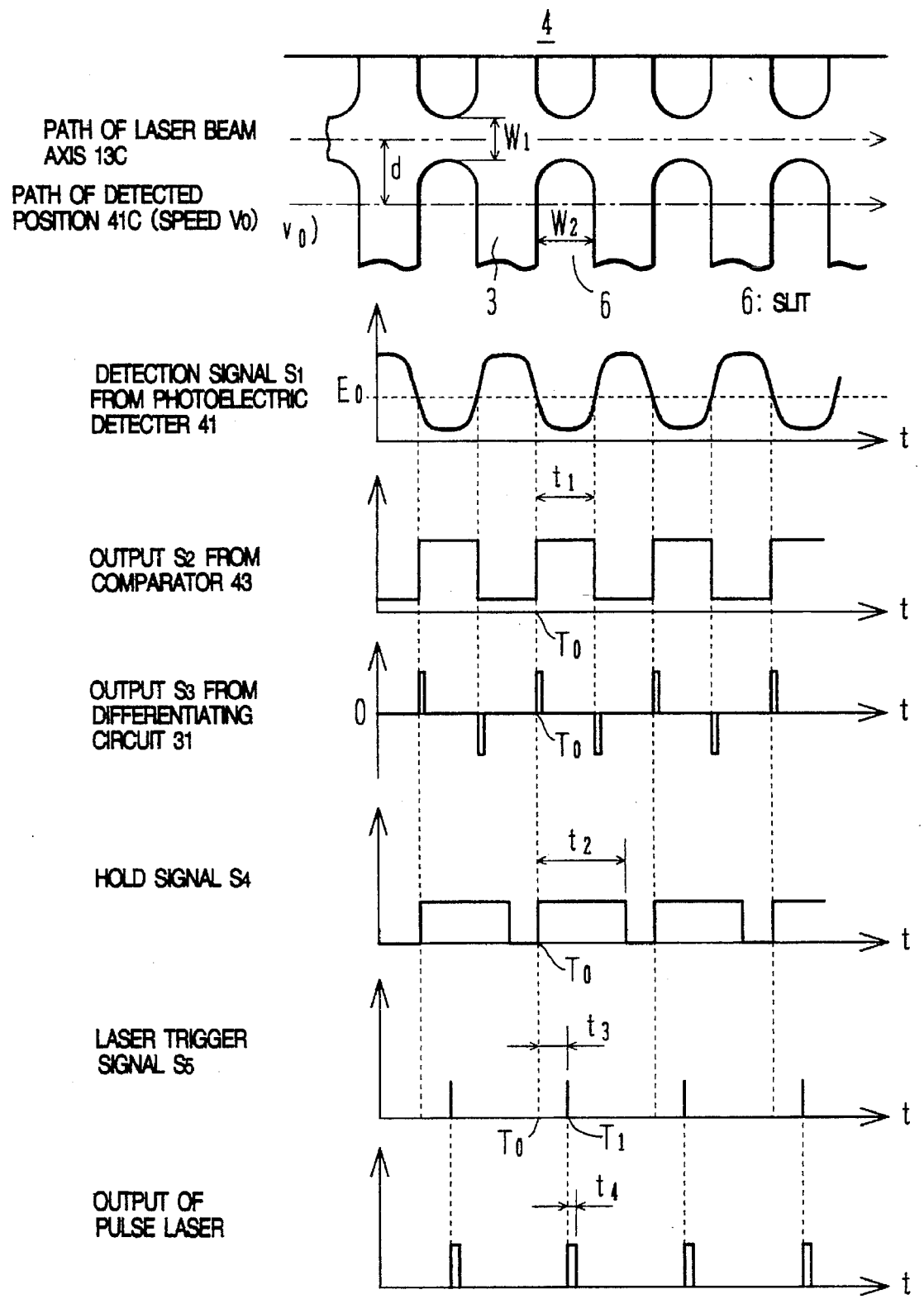
FIG. 8 is a time chart showing signal processing from detection of the array condition of leads to oscillation of a pulsed laser beam.

The detection signal $S_1$ output from the photoelectric detector 41 and amplified by the detection signal amplifier 42 changes, as shown in FIG. 8, such that it takes a high output level in the range corresponding to the lead (web) 3 and a low output level in the range corresponding to a slit 6 between the leads. After that, the signal $S_1$ is input to the comparator 43 where it is binary-coded (into $S_2$) with a predetermined threshold value $E_0$, followed by being input to the differentiating circuit 31 in the control unit 30. The differentiating circuit 31 produces a signal $S_3$ corresponding to rising and falling of the signal $S_2$ from the comparator 43, and the signal $S_3$ is input to the hold circuit 32. Here, $t_1$ in FIG. 8 represents a time during which the spot moves across the width $S_2$ of the slit 6 at the speed $v_0$, and is expressed by:

$$t_1 = W_2/v_0$$

The hold circuit 32 produces a hold signal $S_4$ corresponding to the signal $S_3$ from the differentiating circuit 31. Specifically, the hold circuit 32 raises a pulse at the time $t_0$ where the signal $S_3$ issues a positive pulse output (corresponding to the beginning edge of the slit 6), and lowers the pulse after the raised value has been held for a predetermined time $t_2$ specified by the control circuit 38. Here, the predetermined time $t_2$ specified by the control circuit 38 is set to be longer than $t_1$, but shorter than a time $p/v_0$ during which the spot moves across the lead pitch p at the speed $v_0$, i.e.:

$$t_1 < t_2 < (p/v_0)$$

The hold signal $S_4$ is employed to eliminate other signals than the positive pulse output (corresponding to the beginning edge of the slit 6) of the signal $S_3$.

The hold signal $S_4$ is input to the delay circuit 33 which generates a pulse at the time $T_1$ having elapsed a delay time $t_3$ from the rising time $T_0$ of the hold signal $S_4$, thereby creating a laser trigger signal $S_5$. In other words, the delay circuit 33 outputs the positive pulse of the signal $S_3$ from the differentiating circuit 31 after giving it the delay time $t_3$. The laser trigger signal $S_5$ is input to the laser power supply circuit 34 and, based on the input signal, the laser oscillator 10 oscillates the pulsed laser beam 10A. The pulse width $t_4$ of the pulsed laser beam 10A oscillated at this time is specified by the control circuit 38 along with energy and other various conditions of the pulsed laser beam. Through the signal processing explained above, the pulsed laser beam 13A can be irradiated to the predetermined position on the dam bar 5.

A description will now be made of the delay time $t_3$ given by the delay circuit 33 in order that the pulsed laser beam 13A is irradiated to the center of the dam bar 5. It is here assumed that the total delay time including delays due to responses in the various circuits and a delay until the oscillation of the pulsed laser beam is $\delta_r$. A time $t_A$ during which the laser beam axis 13C moves from the beginning edge of the slit 6 to the center thereof is expressed by:

$$t_A = t_1/2 = W_2/2v_0 \qquad (1)$$

Also, a time $t_B$ from entering of the laser beam axis 13C into the slit 6 to irradiation of the pulsed laser beam upon the dam bar 5 is expressed below by using the delay time $t_3$ given by the delay circuit 33:

$$t_B = \delta_r + t_3 \qquad (2)$$

Since the condition enabling the pulsed laser beam to be irradiated to the center of the dam bar 5 is given by;

$$t_A = t_B \qquad (3)$$

The delay time $t_3$ is expressed below from the equations (1) to (3):

$$t_3 = W_2/(2v_0) - \delta_r \qquad (4)$$

Thus, by setting the delay time $t_3$ as per the equation (4), the pulsed laser beam 13A can be irradiated to nearly the center of the dam bar 5.

To realize satisfactory cutting of the dam bar by using the pulsed laser beam as stated above, the pulse width is desired to be as short as possible. As a result of studies made by the inventors, it has proved that when the dam bar is cut by using a pulsed laser beam emitted from a YAG laser oscillator pumped by pulsed light, satisfactory cutting of the dam bar can be achieved under the condition where the laser beam is emitted with a very short pulse width in the range of 0.1 to 1.0 msec. Supposing the case that the oscillation frequency of the YAG laser oscillator pumped by pulsed light is maximized and the laser beam axis is continuously moved with respect to the workpiece while cutting individual dam bars of a lead frame having the lead pitch of 0.3 mm by one shot of the pulsed laser beam, the moving speed of the cut nozzle 13 with respect to the workpiece 1, i.e., the moving speed v of the work table 21, is expressed by:

$$v = 0.3 \text{ (mm)} \times 300 \text{ (Hz)} = 90 \text{ (mm/sec)} \qquad (5)$$
$$= 5.4 \text{ (m/min)}$$

This is a maximum moving speed of the work table 21. Here, a maximum value of the oscillation frequency of the YAG laser oscillator pumped by pulsed light is 300 Hz and this value is used in the above equation (5).

Assuming now that the pulse width $\tau$ is 0.2 msec, the distance $\Delta L$ through which the laser beam axis 13C relatively moves with respect to the workpiece 1 during the pulse width is:

$$\Delta L = v \times \tau = 90 \text{ (mm/sec)} \times 0.2 \text{ (msec)} \qquad (6)$$
$$= 18 \times 10^{-3} \text{ (mm)}$$
$$= 18 \text{ } \mu m$$

As seen from the foregoing, the pulse width of the pulsed laser beam is in fact a very short time and the distance through which the laser beam axis 13C relatively moves with respect to the workpiece 1 during the pulse width is much smaller than the length, i.e., 0.1 to 0.2 mm, of the dam bar to be cut. Accordingly, by relatively moving the laser beam axis 13C at a constant speed with the work table 21 while oscillating the pulsed laser beam, the irradiated position is uniquely determined in accordance with the oscillation time of the pulsed laser beam, and the dam bars 5 can be successively cut at high speed with certainty.

The shape of the spot 13B in the irradiated position of the pulsed laser beam 13A will now be described with reference to FIG. 9.

Figure 9:
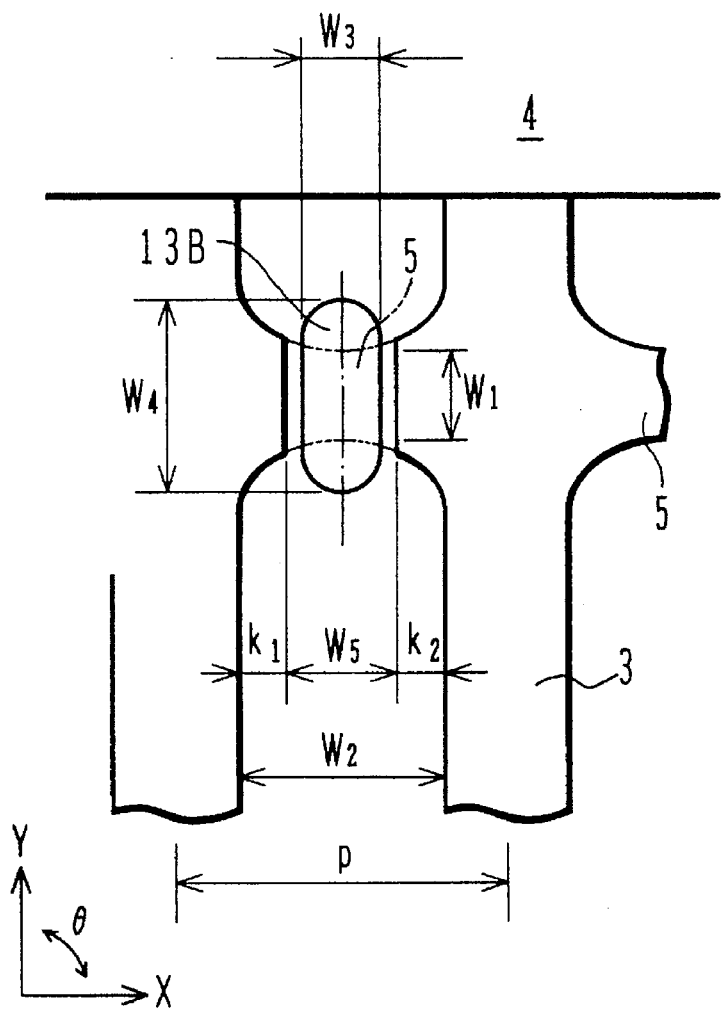
FIG. 9 is a view for defining dimensions which characterize the configuration after cutting the dam bar, and spot dimensions.

First, the dimensions characterizing the configuration after cutting the dam bar and the dimensions of the spot 13B are defined as shown in FIG. 9. That is:

$W_1$: width of the dam bar 5 (also shown in FIGS. 5 and 6)
$W_2$: length of the dam bar 5, i.e., width of the slit 6
$W_3$: width of the spot 13B
$W_4$: longitudinal size of the spot 13B
$W_5$: width of the cut slot after cutting the dam bar
p : lead pitch
$k_1, k_2$: projecting length from the lead side wall (length of the dam bar left after the cutting)

For ensuring the dimensional accuracy of the lead array condition, the EIAJ Standards specify, of the configuration after cutting the dam bar, the projecting lengths $k_1$, $k_2$ from the respective lead side walls and the width $W_2$ of the cut slot after cutting the dam bar, and require that $k_1$, $k_1$ be not less than 0 but not more than ⅕ of the width $W_2$ of the slit, and $W_5$ be not less than ½ of the width $W_1$ of the dam bar.

When the YAG laser is employed and the pulse width, the input heat, etc. are set to meet the proper conditions, the width $W_5$ of the cut slot equal to or somewhat wider than the width $W_3$ of the spot 13B can be achieved by irradiation of the pulsed laser beam 13A. Therefore, a lower limit of the width $W_3$ of the spot 13B needs to be about ½ of the width $W_2$ of the slit 6. Also, if the width $W_3$ of the spot 13B is too large, portions of the leads 3 which are not to be cut would be cut away. Accordingly, an upper limit of the width $W_3$ of the spot 13B is set to about ⅘ of the width $W_2$ of the slit 6.

On the other hand, if the longitudinal size $W_4$ of the spot 13B is set to be comparable to or somewhat longer than the width $W_1$ of the dam bar 5, the input heat would be insufficient at both end portions of the dam bar 5 in the direction of width thereof, resulting in that the cut edges left after cutting the dam bar 5 would be projected at their both end portions into the cut slot in the form of horns. In other words, the projecting lengths $k_1$, $k_2$ would be too large. As a result of studies made by the inventors with the above problem in mind, it has proved that by setting the longitudinal size $W_4$ of the spot 13B to be twice or more the width $W_1$ of the dam bar 5, the cut edges left after cutting the dam bar 5 are not projected at their both end portions into the cut slot in the form of horns, the projecting lengths $k_1$, $k_2$ can be reduced, and hence the cut slot after cutting the dam bar can have a satisfactory configuration. More preferably, by setting $W_4$ to be three or more times $W_1$, the adverse effect due to insufficient input heat can be further lessened.

Summarizing the above-stated conditions, by properly adjusting the position of the spot 13B provided that the longitudinal size $W_4$ of the spot 13B is set to be twice or more (preferably, three or more times) the width of the dam bar and the width $W_3$ of the spot 13B is set to be not less than ½ but not more than ⅘ of the width $W_2$ of the slit 6, the above-mentioned Standards can be substantially satisfied even if materials and lead dimensions are varied case by case. As a result, the dam bar can be cut while leaving a highly accurate and satisfactory configuration.

For example, assuming that the lead frame 2 is made of a 42- alloy (Fe-Ni alloy) as materials, the lead pitch p is 0.3 mm, and the frame thickness is 0.15 mm, the approximate dimensions meeting the above-mentioned standards are below:

p=0.3 mm
$W_1$=0.13±0.02 mm
$W_2$=0.17±0.02 mm
$k_1, k_2$=0 to 0.034 mm
$W_5 \geq 0.085$ mm For these dimensions, the width $W_3$ and longitudinal size $W_4$ of the elliptical spot 13B are inferred as follows. From the conditions of $W_4 \geq 2 \times W_1$, preferably $W_4 \geq 3 \times W_1$ and (⅘)×$W_2 \geq W_3 \geq$ (½)×$W_2$, $W_4$ needs to be about 0.26 mm, preferably about 0.39 mm, and $W_3$ needs to be about 0.13 mm.

Further, assuming that allowable position offsets in the X- and Y-axis directions are ΔX and ΔY, inferred values of these offsets are below:

ΔX=±0.01 mm
ΔY=±0.07 mm

Thus, the position of the spot 13B needs to be adjusted so as to locate within the region defined including the above ranges of position offsets. An allowable angle offset in the rotating direction about the laser beam axis 13C (the θ-direction in FIG. 9) is inferred to be within the range of about ±10°.

Next, the relationship between the spot shape of the pulsed laser beam on the dam bar and the positioning control of the laser beam axis will be described with reference to FIGS. 10 and 11.

Figure 10A:
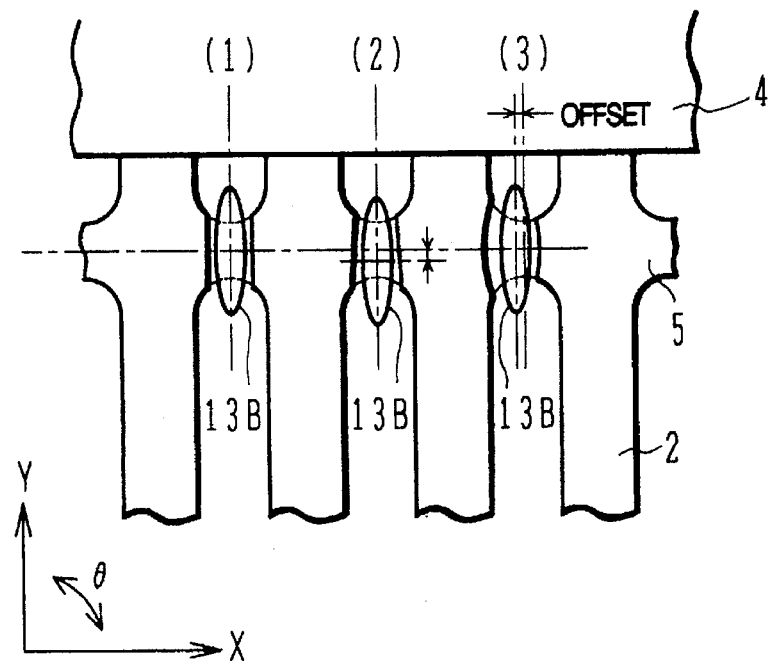
FIG. 10(a) shows the case of using an elliptical spot and FIG. 10(b) shows the case of using a circular spot.
Figure 10B:
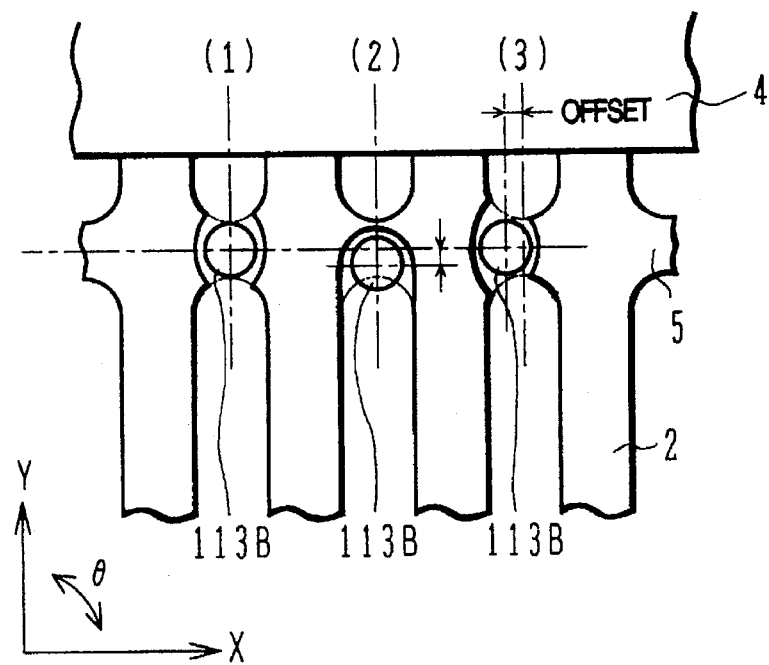

FIG. 10 is a view showing effects upon the configuration after the cutting resulted from position offsets of spots in the X- and Y-axis directions when the dam bars are cut in which: FIG. 10(a) shows the case of using an elliptical spot and FIG. 10(b) shows the case of using a circular spot.

As indicated by (1) in FIG. 10(a), in the case that the laser beam axis is properly positioned by using an elliptical spot 13B, the configuration after the cutting is very satisfactory. As indicated by (1) in FIG. 10(b), in the case of using a circular spot 113B, the configuration after the cutting is also satisfactory if the laser beam axis is properly positioned.

When using the elliptical spot 13B, there are usually three axes, i.e., X-, Y- and θ-axes, as ones to be controlled for positioning the spot, while when using the circular spot 113B, the axes to be controlled for positioning the spot are only two, i.e., X- and Y-axes. In this embodiment, however, since the longitudinal direction of the spot 13B is adjusted to be almost aligned with the longitudinal direction of the lead 3, the θ-axis control is not necessary during the process in which the dam bars 5 present along any one side of the semiconductor device are being cut. Accordingly, in any of the cases of using the elliptical spot 13B and the circular spot 113B, the axes to be actually controlled for positioning the spot are two, i.e., X- and Y-axes.

Consider now the situation that an offset occurs in the Y-axis direction under the state where the spot is properly positioned in the X-axis direction. In the case of using the elliptical spot 13B as indicated by (2) in FIG. 10(a), since the longitudinal size of the spot 13B is set sufficiently long as mentioned above, there are no significant problems even if the positioning accuracy of the laser beam axis 13C in the Y-axis, i.e., in the longitudinal direction of the lead 3, is not so high. Stated otherwise, even if the laser beam axis 13C deviates a little relatively in the Y-direction with deformation of the lead frame ascribed to the shrinkage deformation of the resin mold 4 or any other reason, it is possible to cut the dam bar 5 in the direction of width thereof by one shot irradiation. On the contrary, in the case of using the circular spot 113B as indicated by (2) in FIG. 10(b), the effect of the positioning accuracy in the Y-axis direction is so large that the dam bar 5 cannot be cut completely.

When the spot is deviated in the X-axis direction, the dam bar cannot be cut satisfactorily in any cases as indicated by (3) in FIG. 10(a) and (3) in FIG. 10(b). In the case of using the circular spot 113B, particularly, the dam bar 5 cannot be sometimes cut completely as with the situation indicated by (2) in FIG. 10(b). But these illustrated situations represent the extreme cases. In the process according to this embodiment, since the detection accuracy in the X-axis direction and hence the positioning accuracy of the laser beam axis 13C are high and a sufficient degree of accuracy in cutting by the pulsed laser beam 13A is ensured, such extreme situations can be avoided.

FIG. 11 is a table summarizing the effects upon the configuration after the cutting resulted from position offsets in the X- and Y-axis directions when the dam bars are cut by using the circular spot and the elliptical spot.

When using the circular spot, good cutting can be achieved if there are no position offsets in both the X- and Y-axis directions, but due consideration is required on an allowable offset value for the configuration after the cutting. In the situation where an offset occurs in the Y-axis direction even if there is no offset in the X-axis direction, poor cutting is resulted and the dam bar 5 cannot be cut completely. Also, in the situation where an offset occurs in the X-axis direction, but no offset occurs in the Y-axis direction, somewhat poor cutting is resulted. If the offset is large, a recess is formed in the lead portion, resulting in poor cutting. Further, in the situation where position offsets occur in both the X- and Y-axis directions, poor cutting is apparently resulted and the joint portion cannot be cut completely. It is thought that the above-stated situations are almost equally applied to the case where the longitudinal size of the elliptical spot is not sufficiently long like the first prior art explained before.

On the other hand, for the elliptical spot used in this embodiment, very good cutting can be achieved if there are no position offsets in both the X- and Y-axis directions. Even in the situation where no offset Occurs in the X-axis direction, but an offset occurs in the Y-axis direction, good cutting can be achieved if due consideration is paid on an allowable offset value for the configuration after the cutting. Also, in the situation where an offset occurs in the X-axis direction, but no offset occurs in the Y-axis direction, somewhat poor cutting is resulted. Further, in the situation where position offsets occur in both the X- and Y-axis directions, somewhat poor cutting is also resulted.

As will be seen from the foregoing, by using the elliptical spot 13B like this embodiment, the configuration after the cutting can be almost satisfactory even with not so much consideration paid on the positioning accuracy of the laser beam axis 13C in the longitudinal direction of the lead 3, and the direction in which the positioning control must be performed is only the X-axis direction. In other words, the positioning only required by the work table 21 is only required to be made as uniaxial control when the laser beam axis 13C is relatively moved with respect to the workpiece 1. It is sufficient for the positioning control in the other directions to be made in a somewhat rough manner prior to the start of the working. Of course, in any type of working, with the smaller number of axes subjected to positioning control, the control can be facilitated, the structure of the apparatus can be simplified, and cost thereof can be reduced. This embodiment is also very advantageous from that point of view.

Next, one example of the sequence for cutting all the dam bars of the semiconductor device by repeating the signal processing shown in FIG. 8 will be described with reference to FIGS. 12 to 14.

Figure 12:
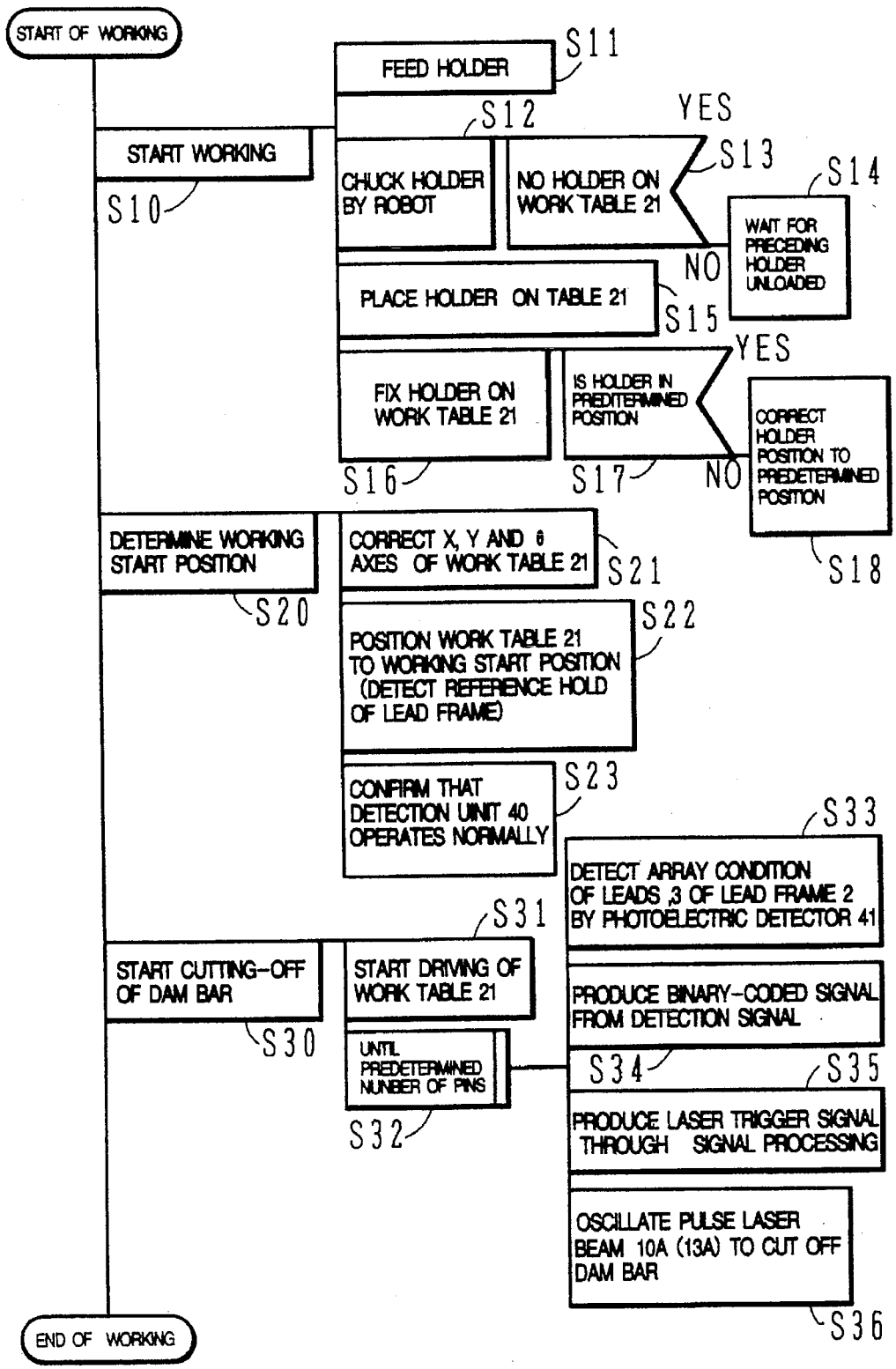
FIG. 12 is a flowchart showing the sequence of cutting the dam bars.

FIG. 12 is a flowchart showing the sequence of cutting the dam bars. First, in step S10 of FIG. 12, preparation for the working is performed. More specifically, a holder including the workpiece (semiconductor device) 1 fixed thereto is fed to a predetermined position in step S11, the holder is chucked by a robot (step S12), and then it is confirmed that no preceding holder is present on the work table 21 of the dam bar cutting apparatus (step S13). Here, if the preceding holder still exists on the work table 21, the control flow waits for the preceding holder being unloaded (step S14). If there is no preceding holder on the work table 21, the control flow goes to step S15 where the holder is placed on the work table 21. Then the holder is fixed to the work table (step S16). It is then confirmed in step S17 whether the holder is in the predetermined position or not. If not so, the holder is corrected in its position and moved to the predetermined position (step S18).

Next, in step S20, the working start position is determined. More specifically, in step S21, the X-, Y- and θ-axes of the work table 21 are corrected respectively through the X-table 22, the Y-table 23 and the θ-table 24. Then, the work table 21 is moved and positioned so that the work nozzle 13 comes to the working start position. This working start position is a reference hole 7a (see FIG. 13) described later. Further, it is confirmed in step S23 whether the detecting unit 40 operates normally or not.

After that, cutting the dam bars is started in step S30. More specifically, driving of the work table 21 is started in step S31, and the sequence from step S33 to S36 which corresponds to the signal processing shown in FIG. 8 is repeated until reaching the predetermined number of pins (step S32). Of these steps S33 to S36 repeated, the array condition of the leads 3 in the lead frame 2 is detected by the photoelectric detector 41 in step S33, the binary-coded signal $S_2$ is produced from the detection signal $S_1$ in step S34, the laser trigger signal $S_5$ is produced through the signal processing in step S35, and the pulsed laser beam 10A (13A) is oscillated in step S36, thereby cutting each of the dam bars.

Figure 13:
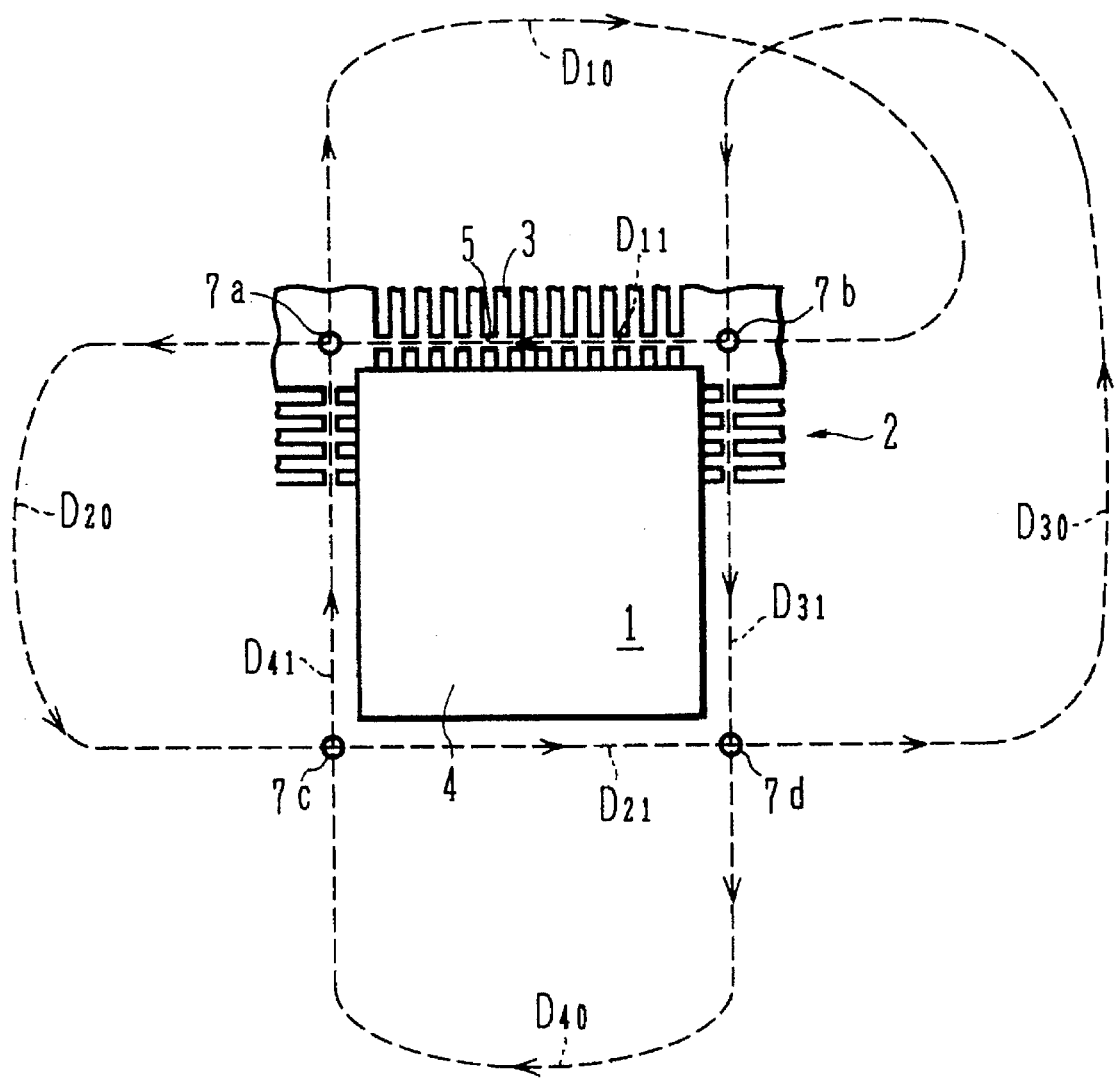
FIG. 13 is a view showing one example of the path along which the work nozzle, i.e., the laser beam axis, is moved when cutting all the dam bars of a semiconductor device.
Figure 14:
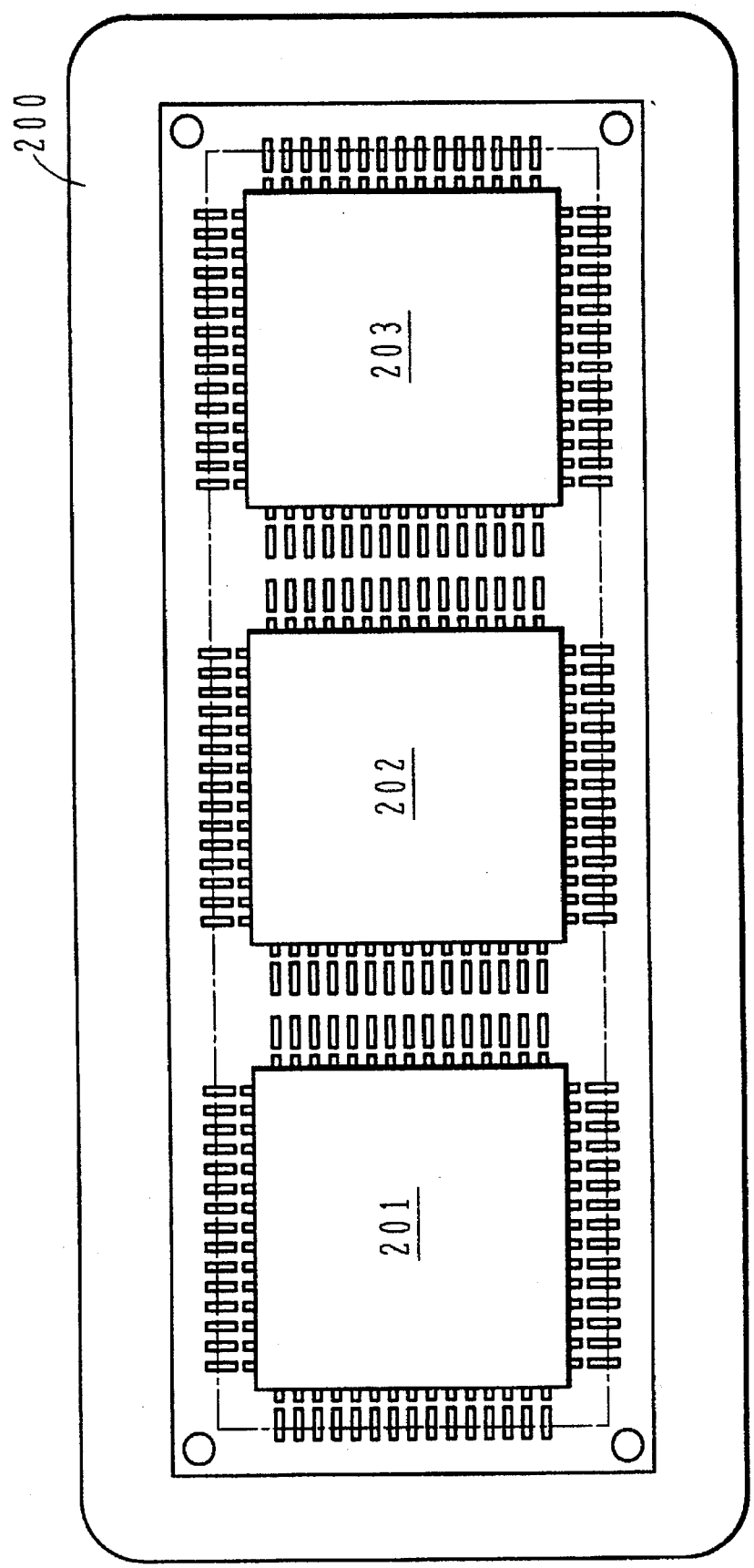
FIG. 14 is a view showing the condition where three semiconductor devices are assembled into a one-piece unit, this one-piece unit of plural semiconductor devices being fixed to a holder.

FIG. 13 is a view showing one example of the path along which the work nozzle 13 is moved when cutting all the dam bars 5 of the semiconductor device 1 in step S30. This view also shows the path along which the laser beam axis 13C is moved. As mentioned before, however, it is in fact that the work nozzle 13 is not moved in itself, but relatively moved with respect to the semiconductor device 1 as the work table 21 moves.

As shown in FIG. 13, reference holes 7a to 7d are each formed in a position where extensions of lines interconnecting the dam bars 5 along two sides of the lead frame 2 intersect each other, and the relative movement of the work nozzle 13 is started from, for example, the position of one reference hole 7a (the working start position in step S20). First, the work nozzle 13 is relatively moved from the reference hole 7a along a path $D_{10}$. During this movement, the moving speed of the work nozzle 13 is adjusted to a constant vale ($v_0$ referred to in the above description) before reaching the reference hole 7b. Then, the dam bars 5 are cut along an upper side as shown in FIGS. 6 and 8 while relatively moving the work nozzle 13 from the reference hole 7a along a path $D_{11}$ at the constant speed $v_0$. Further, after relatively moving the work nozzle 13 from the reference hole 7a to the reference hole 7c along a path $D_{20}$, the dam bars 5 are cut along an lower side while relatively moving the work nozzle 13 along a path $D_{21}$ at the constant speed $v_0$. Subsequently, all the remaining dam bars 5 are cut while relatively moving the work nozzle 13 from the reference hole 7d to the reference hole 7a through a path $D_{30}$, the reference hole 7b, a path $D_{31}$, the reference hole 7d, a path $D_{40}$, the reference hole 7c and a path $D_{41}$ in sequence. In the above process, the paths $D_{10}$, $D_{20}$, $D_{30}$ and $D_{40}$ which are not present on the dam bars 5 each serve as an approach zone where the work nozzle 13 is adjusted so as to reach the constant speed $v_0$.

When cutting the dam bars 5 in such a way, the longitudinal beam transformer 11a, the transverse beam transformer 11b, and the beam rotator 11c (see FIG. 1) are appropriately operated so that the longitudinal direction of the spot 13B is almost aligned with the longitudinal direction of the lead 3 for a group of the dam bars 5 along each side of the semiconductor device 1.

Further, the process of cutting the dam bars may be modified as follows. As shown in FIG. 14, by way of example, three semiconductor devices 201 to 203 may be assembled into a one-piece unit, this one-piece unit of plural semiconductor devices being fixed to a holder 200 which is in turn mounted as a workpiece on the work table 21. In this case, the path along which the work nozzle 13 is to be moved can be optionally selected based on the path shown in FIG. 13. Further, the present invention is not limited to such a modification in which three semiconductor devices are assembled into a one-piece unit as shown in FIG. 14, but a plurality of semiconductor devices other than three may be handled as a one-piece unit, for example, such that three sets, each comprising a one-piece unit of three semiconductor devices, are assembled into a one-piece unit consisted of total nine semiconductor devices. By so doing, it is possible to increase productivity of the semiconductor devices including the step of cutting the dam bars, avoid the lead frames from being deformed due to handling or any other reason in the course of manufacture process, and hence maintain the highly accurate and satisfactory configuration of the leads frames.

Additionally, after roughly correcting the position of the workpiece in the X-, Y- and θ-axis directions by the work table, the work head may be moved in the X- and Y-axis directions for fine correction. As an alternative, only the work head may be moved without moving the work table.

Next, the construction of a resin-mold sealed semiconductor device in which the dam bars 5 are cut by the dam bar cutting apparatus and method as stated above will be described with reference to FIG. 15.

Figure 15:
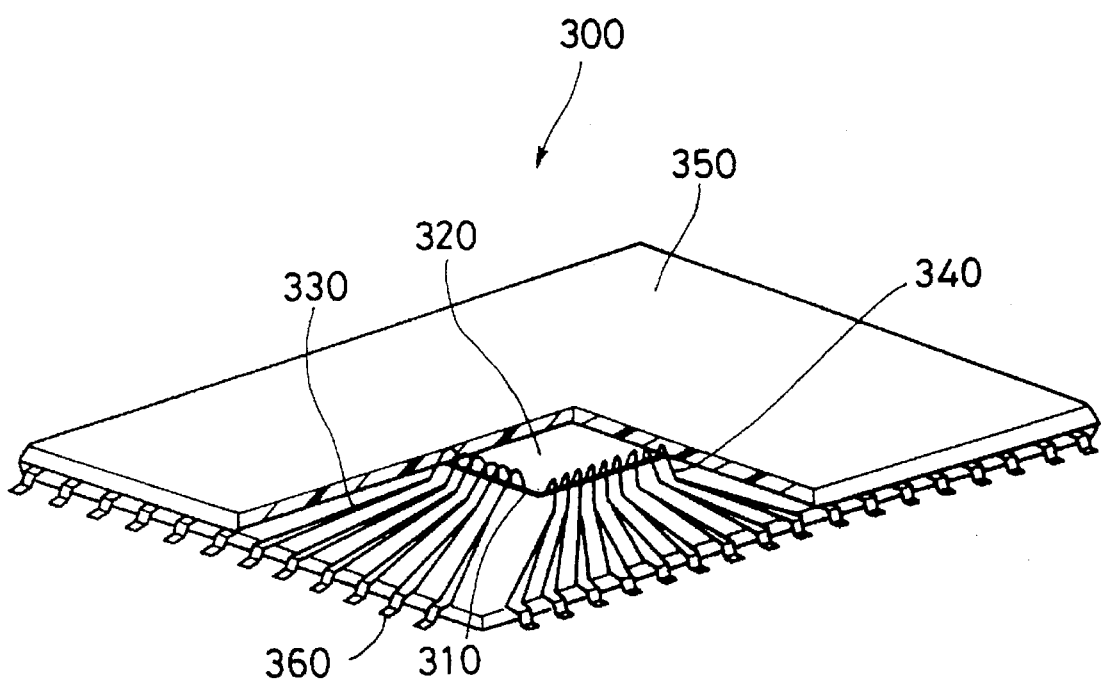
FIG. 15 is a view showing the construction of a resin-mold sealed semiconductor device in which dam bars are cut by the dam bar cutting apparatus and method according to the present invention.

In a semiconductor device 300 (product) shown in FIG. 15, a semiconductor chip 320 is mounted on a die pad 310, inner leads 330 are electrically connected to corresponding terminals of the semiconductor chip by wires 340 such as gold wires, and a portion including the semiconductor chip 320 and the inner leads 330 is sealed by a resin mold 350. Outer leads 360 are separated from one another because of the dam bars having been cut and removed, and are bent outwardly of the resin mold 350 into the gull-wing form as mentioned before. The bent portions of the outer leads 360 are connected to a circuit pattern on a printed board when the semiconductor device 300 is mounted on the printed board later.

Figure 16A:
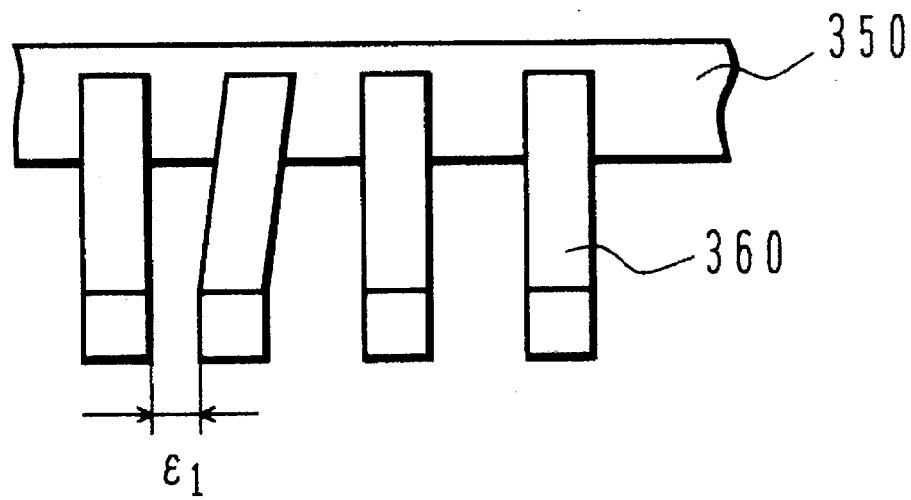
FIG. 16(a) shows the condition where the outer leads are inclined obliquely.
Figure 16B:
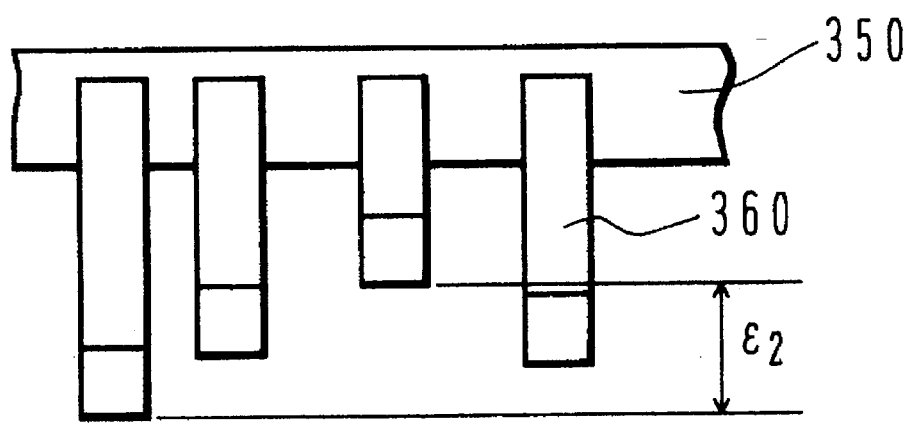
FIG. 16(b) shows the condition where bottom surfaces (i.e., surfaces joined to a printed board) of bent portions of the outer leads are not uniform in height.

If the configurations of the cut edges left after cutting the dam bars are not satisfactory, there may occur torsional deformations or differences in amount of spring-back during the subsequent bending step of the outer leads 360. This gives rise to irregular deformations and hence uneven array condition of the outer leads. For example, as shown in FIG. 16(a), the outer leads 360 after being bent are inclined obliquely and the spacing between the outer leads is too narrowed as indicated by $\epsilon_1$, or as shown in FIG. 16(b), bottom surfaces (i.e., surfaces joined to a printed board) of the bent portions of the outer leads 360 are not uniform in height with a resultant difference $\epsilon_2$ therebetween. Such a deformation would lead to bonding failures in the surface mounting step. Incidentally, FIG. 16 is a view looking at, from the outer lead side, the semiconductor device after the outer leads have been bent.

In semiconductor devices using high pin count, fine-pitch lead frames, particularly, the configuration accuracy of outer leads after bending are specified to be very strict by the EIAJ Standards, for example, with the aim to avoid bonding failures in the surface mounting step. However, that strict configuration accuracy of outer leads cannot be satisfied if the outer leads 360 are bent with poor dimensional accuracy as shown in FIG. 16.

By contrast, in this embodiment, since the configurations after cutting the dam bars can be always highly accurate and satisfactory, the poor condition as shown in FIG. 16 can be avoided to surely provide satisfactory configurations and high geometric accuracy of the outer leads after being bent. As a result, it is possible to prevent bonding failures in the surface mounting step to the printed board and hence manufacture a high-performance electronic equipment with high quality.

If the dam bar is not penetrated through (i.e., cannot be cut completely) by one shot irradiation of the pulsed laser beam, several shots of the pulsed laser beam must be irradiated to the dam bar for complete cutting. In this case, the working process along the above-explained paths needs to be repeated several times. Furthermore, in this case, while the longitudinal size $W_4$ of the spot 13B is required to be twice or more the width $W_1$ of the dam bar 5, the width $W_3$ of the spot 13B is required to be not more than ⅘ of the width $W_2$ of the slit 6, but not necessarily not less than ½.

With this embodiment described above, since the longitudinal size of the spot 13B is adjusted to be twice or more the width of the dam bar 5 by the longitudinal beam transformer 11a and the transverse size of the spot 13B is adjusted to be not less than ½ but not more than ⅘ of the length of the dam bar 5 by the transverse beam transformer 11b, the input heat is so sufficiently applied to both end portions of the dam bar 5 in the direction of width thereof that the opposing cut edges left after cutting the dam bar 5 will not be projected into the cut slot in the form of horns, but extend substantially parallel to each other, and the projecting portions from the lead side walls can be lessened. Further, since the beam rotator 11c is appropriately operated to make the longitudinal direction of the spot 13B substantially aligned with the longitudinal direction of the lead 3 so that the spot 13B lies across the width $W_1$ of the dam bar 5, the dam bar 5 can be cut in the direction of width thereof by one shot irradiation of the pulsed laser beam 13A. The within- dam resin 4a and the resin burrs 4b can also be removed at the same time, resulting in a highly accurate and satisfactory configuration after cutting the dam bar.

In the above process, no significant problems arise even if the positioning accuracy of the laser beam axis 13C in the longitudinal direction of the lead 3 is not so high. Thus, even if the laser beam axis 13C deviates a little relatively in the longitudinal direction of the lead 3 with deformation of the lead frame 2 ascribed to the shrinkage deformation of the resin mold 4 or any other reason, it is possible to surely cut the dam bar 5 in the direction of width thereof by one shot irradiation.

Since so much consideration is not needed on the positioning accuracy of the laser beam axis 13C in the longitudinal direction of the lead 3 as mentioned above, the positioning control is only required to be made in one axial direction (e.g., the X-axis direction) when the laser beam axis 13C is relatively moved with respect to the workpiece 1. It is sufficient for the positioning control in the other directions to be made in a rough manner prior to the start of the working. Accordingly, the control can be facilitated and the structure and cost of the apparatus can be simplified and reduced.

Further, since the array condition of the individual leads 3 are detected and the cut position for each of the dam bars 5 is determined based on the detection signal, the cutting can be performed with high accuracy. Also, just by relatively moving the laser beam axis 13C at the speed $v_0$ with the work table 21 while oscillating the pulsed laser beam 13A, the dam bars 5 can be cut successively and the reliable, high-speed working can be achieved.

In this embodiment, the detection light 41A based on the lead array condition is detected by the photoelectric detector 41, the detection signal $S_1$ is binary-coded into the signal $S_2$ by the comparator 43, and the oscillation of the laser oscillator 10 is controlled by the signal given with the appropriate time delay $t_3$ through the signal processing carried out via the differentiating circuit 31, the hold circuit 32, the delay circuit 33 and the trigger signal generator 34. Therefore, the pulsed laser beam 13A can be precisely irradiated to the dam bar 5. Also, by setting the time delay $t_3$ appropriately, the dam bar 5 can be cut almost at the center thereof. Further, since the above process is carried out through the electric signal processing alone, no mechanical control elements are present and the process is not affected at all by inertial force and vibration otherwise caused, for example, when the work table 21 or so is accelerated and decelerated.

Moreover, in this embodiment, since the configurations after cutting the dam bars can be always highly accurate and satisfactory, the outer leads 360 after being bent can surely have satisfactory configurations and high geometric accuracy. As a result, it is possible to improve the dimensional accuracy of the semiconductor device itself, prevent bonding failures in the surface mounting step to the printed board, and hence manufacture a high-performance electronic equipment with high quality.

Also, since the longitudinal size $W_4$ of the spot 13B is set to be twice or more (preferably, three or more times) the width of the dam bar and the width $W_3$ of the spot 13B is set to be not less than ½ but not more than ⅘ of the width $W_2$ of the slit 6, the EIAJ standards can be substantially satisfied even if materials and lead dimensions are varied case by case.

Further, since the detection light 41A having passed through the opening 13a of the work nozzle 13 is captured by the photoelectric detector 41, the photoelectric detector 41 is protected. Also, since the lead array condition at a position immediately prior to the laser beam axis 13C, disturbance elements are less apt to enter the system from the exterior during the period from the detection to the cutting and hence the arrangement is suitable for fine working.

Because of using the photoelectric detector 41, the detection light can be captured through the opening 13a of the work nozzle 13 at a sufficiently remote place.

Additionally, since an image of the dam bar 5 and thereabout is picked up by the TV camera 18 through the opening 13a at the tip end of the work nozzle 13 for displaying the image on the monitor TV 18c, and the laser beam axis 13C and the detected position 41C are simultaneously indicated on the same image, it is possible to easily confirm, adjust and manage the mount condition of the workpiece 1, the cutoff start position and the cutting path of the dam bars 5, as well as the laser beam axis 13C and the detected position 41C during the cutting of the dam bars 5, while looking at the monitor TV 18c.

INDUSTRIAL APPLICABILITY

According to the present invention, the longitudinal size of an oblong spot on a dam bar is adjusted to be twice or more the width of the dam bar by longitudinal beam transforming means, the transverse size of the spot is adjusted to be not less than ½ but not more than ⅘ of the length of the dam bar by transverse beam transforming means, and the longitudinal direction of the spot is adjusted to be substantially aligned with the longitudinal direction of the lead by beam rotating means so that the spot lies across the width of the dam bar. Therefore, the dam bar can be cut in the direction of width thereof by one shot irradiation of the pulsed laser beam, input heat is sufficiently applied to both end portions of the dam bar in the direction of width thereof, and the within-dam resin and the resin burrs can also be removed at the same time, resulting in a highly accurate and satisfactory configuration after cutting the dam bar.

Also, no significant problems arise even if the positioning accuracy of a laser beam axis in the longitudinal direction of a lead is not so high. Thus, even if the laser beam axis deviates a little relatively in the longitudinal direction of the lead with deformation of the lead frame ascribed to the shrinkage deformation of a resin mold or any other reason, it is possible to surely cut the dam bar in the direction of width thereof by one shot irradiation. As a result, since positioning control is only required to be made in one axial direction, the control can be facilitated and the structure and cost of the apparatus can be simplified and reduced.

Further, since the array condition of the individual leads are detected and the timing to irradiate the pulsed laser beam is controlled based on the detection signal so that the pulsed laser beam is irradiated to a predetermined position on the dam bar, the dam bar can be surely cut with high accuracy. Also, just by relatively moving the laser beam axis while oscillating the pulsed laser beam, the dam bar can be cut successively and the reliable, high-speed working can be achieved. In addition, since the working process is carried out through electric signal processing alone, no mechanical control elements are present and the process is not affected at all by inertial force and vibration otherwise caused.

Moreover, according to the present invention, since the configurations after cutting the dam bars can be always highly accurate and Satisfactory, outer leads after being bent can surely have satisfactory configurations and high geometric accuracy. As a result, it is possible to improve the dimensional accuracy of a semiconductor device itself, prevent bonding failures in the surface mounting step to a printed board, and hence manufacture a high-performance electronic equipment with high quality.

Additionally, according to the present invention, semiconductor devices can be efficiently mass-produced with the reduced cost.

What is claimed is:

1. A dam bar cutting apparatus for irradiating a pulsed laser beam (13A) to dam bars (5) of a lead frame (2) in a semiconductor device (1) and cutting said dam bars (5) successively, said dam bar cutting apparatus comprising a laser oscillator (10) for oscillating a pulsed laser beam (10A), a cutting optical system (14, 16) for guiding said pulsed laser beam (10A) to the cut position of a workpiece, a work nozzle (13) for emitting said pulsed laser beam (13A) guided by said cutting optical system (14, 16) therethrough and being provided at its tip end with an opening (13a) for ejecting assist gas (17A) therethrough, carriage means (21) for relatively moving an optical axis (13C) of said pulsed laser beam (13A) at a constant speed with respect to said workpiece, detection light generating means (44) for irradiating detection light (44A) to each of said dam bars (5) to be cut and thereabout on said lead frame (2), light detecting means (41) for receiving the detection light (41A) reflected by said lead frame (2) and generating a corresponding detection signal, and control means (30) for determining the timing to irradiate said pulsed laser beam (13A) based on the detection signal from said light detecting means (41) and controlling said laser oscillator (10) so that said pulsed laser beam (13A) is irradiated to a predetermined position on said dam bar (5), wherein said dam bar cutting apparatus further comprises:

longitudinal beam transforming means (11a) for transforming said pulsed laser beam (10A) oscillated from said laser oscillator (10) into a pulsed laser beam (10B) having an oblong cross-sectional shape so that the longitudinal size ($W_4$) of a spot (13B) of said pulsed laser beam (10A) on said dam bar (5) is twice or more the width ($W_1$) of said dam bar (5), transverse beam transforming means (11b) for transforming said pulsed laser beam (10B) so that the transverse size ($W_3$) of said spot (13B) of said pulsed laser beam (10B) on said dam bar (5) is not less than ½ but not more than ⅘ of the length ($W_2$) of said dam bar (5), and beam rotating means (11c) for rotatively displacing said spot (13B) about the optical axis (13C) of said pulsed laser beam (13A).

2. A dam bar cutting apparatus according to claim 1, wherein said light detecting means (41) receives the detection light (41A) reflected by said lead frame (2) and passed through the opening (13a) of said work nozzle (13).

3. A dam bar cutting apparatus according to claim 1, wherein said light detecting means (41) is a photoelectric detector for converting change in the intensity of incident light into an electric signal and outputting said electric signal.

4. A dam bar cutting apparatus according to claim 1, further comprising monitoring image pick-up means (18) for picking up an image of said dam bar (5) and thereabout through the opening (13a) at the tip end of said work nozzle (13), and monitoring image display means (18c) for simultaneously displaying the optical axis (13C) of said pulsed laser beam (13A) irradiated to said dam bar (5) and the irradiated position of the detection light (44A) from said detection light generating means (44) on the image picked up by said monitoring image pick-up means (18).

5. A dam bar cutting method for irradiating a pulsed laser beam (13A) from a laser oscillator (10) to dam bars (5) of a lead frame (2) in a semiconductor device (1) while relatively moving an optical axis (13C) of said pulsed laser beam (13A) at a predetermined speed with respect to said semiconductor device (1), thereby cutting said dam bars (5) successively, said dam bar cutting method comprising the steps of irradiating detection light (44A) to each of said dam bars (5) to be cut and thereabout on said lead frame (2), receiving the detection light (41A) reflected by said lead frame (2) and generating a corresponding detection signal, determining the timing to irradiate said pulsed laser beam (13A) based on said detection signal, and controlling oscillation of said pulsed laser beam (13A) so that said pulsed laser beam (13A) is irradiated at said timing to a predetermined position on said dam bar (5), wherein said dam bar cutting method further comprises the steps of:

transforming said pulsed laser beam (13A) oscillated from said laser oscillator (10) into a pulsed laser beam (10B) having an oblong cross-sectional shape so that the longitudinal size ($W_4$) of a spot (13B) of said pulsed laser beam (13A) on said dam bar (5) is twice or more the width ($W_1$) of said dam bar (5), transforming said pulsed laser beam (10B) so that the transverse size ($W_3$) of said spot (13B) of said pulsed laser beam (13A) on said dam bar (5) is not less than ½ but not more than ⅘ of the length ($W_2$) of said dam bar (5), rotatively displacing said spot (13B) about the optical axis (13C) of said pulsed laser beam (13A) so that the longitudinal direction of said spot (13B) is substantially aligned with the longitudinal direction of said lead (3), and irradiating said pulsed laser beam (13A) so that said spot (13B) lies across said dam bar in the direction of width thereof.

* * * * *